(12) United States Patent
Nishinohara

(10) Patent No.: US 6,812,104 B2
(45) Date of Patent: Nov. 2, 2004

(54) MIS SEMICONDUCTOR DEVICE AND METHOD OF FABRICATING THE SAME

(75) Inventor: Kazumi Nishinohara, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/236,947

(22) Filed: Sep. 9, 2002

(65) Prior Publication Data

US 2003/0006457 A1 Jan. 9, 2003

Related U.S. Application Data

(62) Division of application No. 09/344,105, filed on Jun. 24, 1999, now Pat. No. 6,465,842.

(30) Foreign Application Priority Data

Jun. 25, 1998 (JP) ............................................ 10-178654

(51) Int. Cl.[7] ............................................ H01L 21/336
(52) U.S. Cl. ........................ 438/300; 438/303; 438/270
(58) Field of Search ................................. 438/300–303, 438/592, 589, 270; 257/330–334, 396, 329, 394, 372

(56) References Cited

U.S. PATENT DOCUMENTS

| | | | |
|---|---|---|---|
| 4,685,196 A | | 8/1987 | Lee ............................ 438/282 |
| 4,939,100 A | | 7/1990 | Jeuch et al. .................. 437/44 |
| 5,342,796 A | | 8/1994 | Ahn et al. ..................... 437/41 |
| 5,408,116 A | | 4/1995 | Tanaka et al. .............. 257/327 |
| 5,583,064 A | | 12/1996 | Lee et al. .................... 438/300 |
| 5,814,544 A | | 9/1998 | Huang ........................ 438/291 |
| 5,998,835 A | * | 12/1999 | Furukawa et al. ........... 257/330 |
| 6,063,677 A | * | 5/2000 | Rodder et al. ............... 438/300 |
| 6,117,741 A | * | 9/2000 | Chatterjee et al. .......... 438/299 |
| 6,346,447 B1 | * | 2/2002 | Rodder ....................... 438/300 |

FOREIGN PATENT DOCUMENTS

| | | |
|---|---|---|
| JP | 63-288065 | 11/1988 |
| JP | 2-98939 | 4/1990 |
| JP | 02098939 A | 4/1990 |
| JP | 2-110973 | 4/1990 |
| JP | 03029327 A | 2/1991 |
| JP | 5-259446 | 10/1993 |
| JP | 06224424 A | 8/1994 |

OTHER PUBLICATIONS

Y. Nakahara, et al., *Ultra–shallow in–situ–doped raised source/drain structure for sub–tenth micron CMOS*, 1996 Symposium on VLSI Technology Digest of Technical Papers, pp. 174–175.

Shigeru Nishimatsu, et al., *Grooved Gate MOSFET*, Japanese Journal of Applied Physics, vol. 16 (1977) Supplement 16–1, pp. 179–183.

* cited by examiner

Primary Examiner—Shouxiang Hu
(74) Attorney, Agent, or Firm—Finnegan, Henderson, Farabow, Garrett & Dunner, L.L.P.

(57) ABSTRACT

A MIS type semiconductor device comprises a semiconductor layer provided with a recess portion having a side wall with an obtuse angle at least at a portion of the recess portion, a gate electrode formed over a bottom surface of the recess portion, with a gate insulating film interposed, a source region and a drain region formed on sides of the gate electrode with an insulating film interposed, such that boundary planes between the source region and the drain region, on one hand, and the insulating film, on the other hand, are formed in the semiconductor layer at an angle to a surface of the semiconductor layer, and wiring portions for contact with the surface of the semiconductor layer. Wherein an edge of the gate electrode is located inside the recess portion provided in the semiconductor layer, and there is provided at least one of a mutually opposed portion between the gate electrode and the source region and a mutually opposed portion between the gate electrode and the drain region, whereby at least one of a portion of the source region and a portion of the drain region, which lie in the associated mutually opposed portions, functions as an accumulation layer.

3 Claims, 25 Drawing Sheets

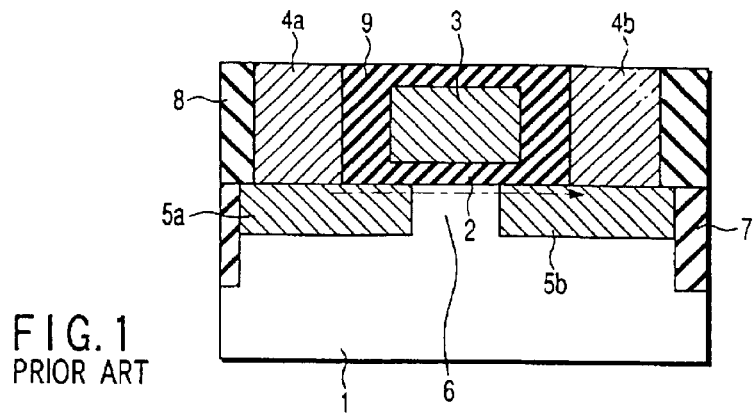
FIG. 1
PRIOR ART
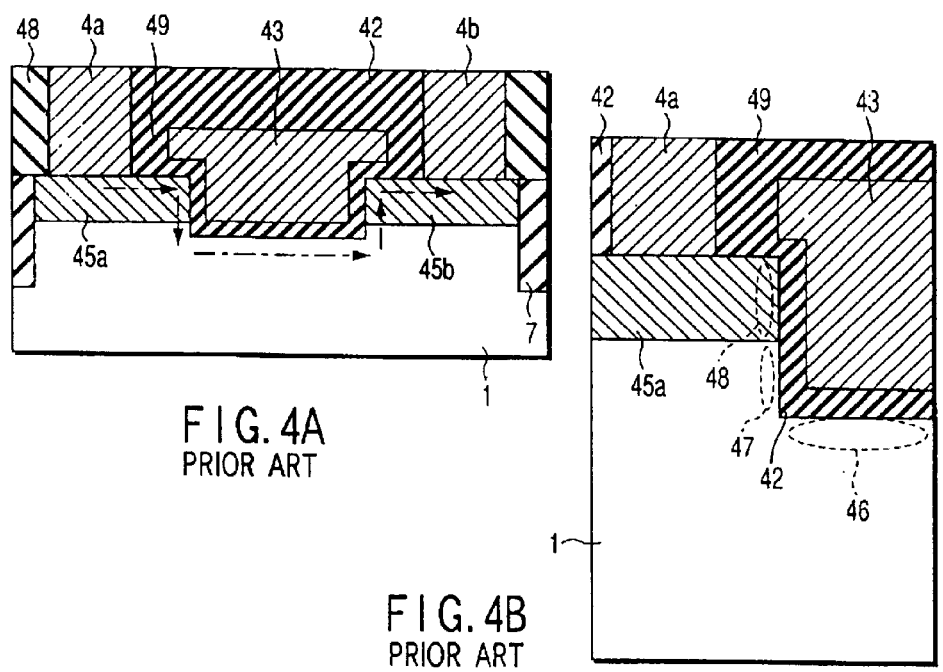
FIG. 4A
PRIOR ART
FIG. 4B
PRIOR ART
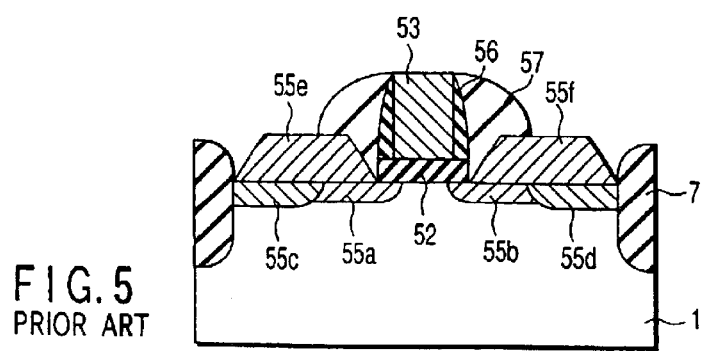
FIG. 5
PRIOR ART

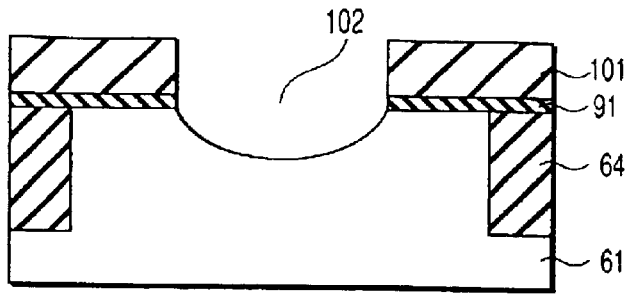
F I G. 10A
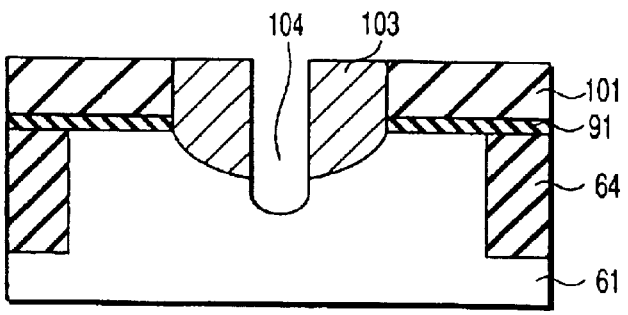
F I G. 10B
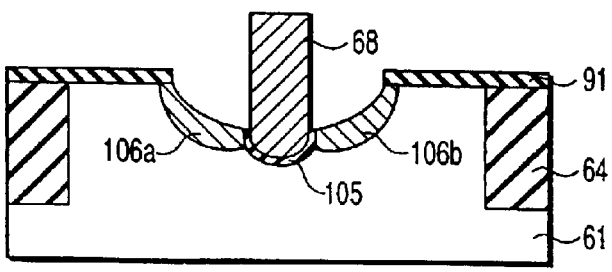
F I G. 10C
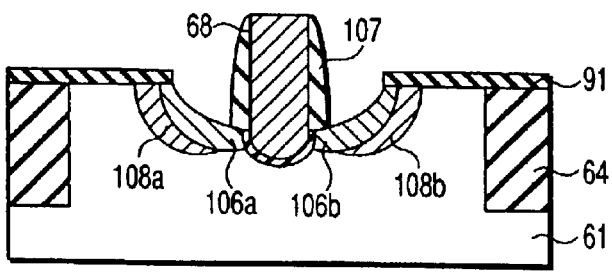
F I G. 10D
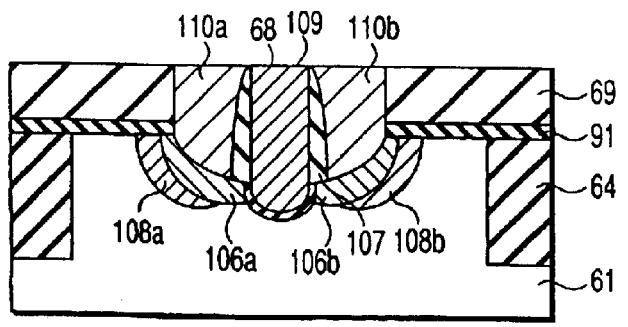
F I G. 10E

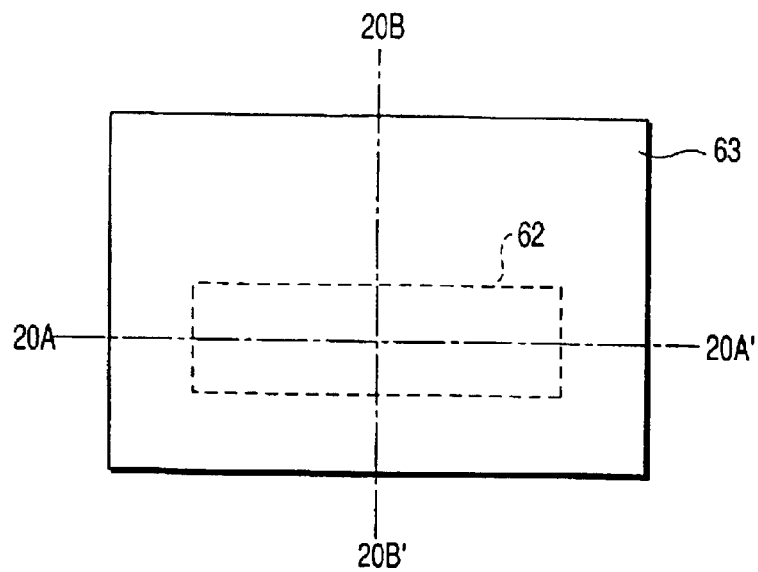
F I G. 20A
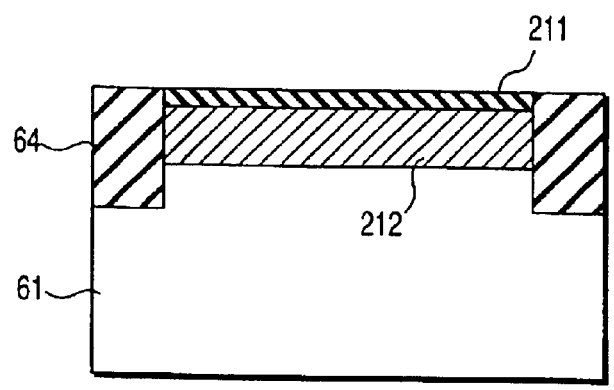
F I G. 20B
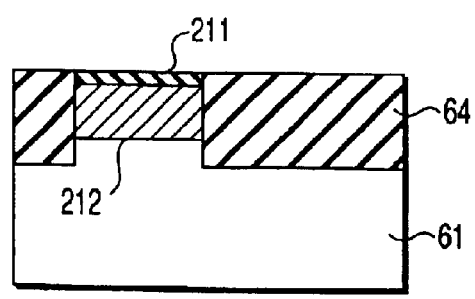
F I G. 20C

MIS SEMICONDUCTOR DEVICE AND METHOD OF FABRICATING THE SAME

This is a division of application Ser. No. 09/344,105, filed Jun. 24, 1999, now U.S. Pat. No. 6,465,842, which is incorporated herein by reference.

BACKGROUND OF THE INVENTION

The present invention relates generally to a MIS semiconductor device and a method of fabricating the same, and more particularly to improvements of a source region and a drain region.

In order to meet a demand for a higher performance based on a higher integration density achieved by modern finer processing, when semiconductor integrated circuits (ICs) are fabricated, a gate electrode of a transistor is processed with a highest possible level of lithographic processing. Because of this, a variance occurs among gate electrodes and it leads to a variance in channel length and thus to a greater variance in transistor characteristics. Consequently, the product yield decreases. On the other hand, with miniaturization of semiconductor ICs, fine transistors and wiring are arranged very dense and the length of wiring increases. Even if the operation speed of transistors is to be increased based on the miniaturization, this cannot be achieved due to a parasitic capacitance and resistance between transistors and wiring.

FIG. 1 shows a structure of a conventional flat-type transistor. A gate electrode 3 is formed on a silicon substrate 1, with a gate insulation film 2 interposed. Wiring elements 4a, 4b are formed on both sides of the gate electrode 3, with an insulation film 9 interposed. A source diffusion layer 5a and a drain diffusion layer 5b are formed within the silicon substrate 1. A region 6 between the diffusion layers 5a and 5b serves as a channel region. Numeral 7 denotes a device isolating insulation film, and numeral 8 an interlayer insulation film 8.

Since the diffusion layers 5a and 5b are arranged adjacent to the channel region 6 within the silicon substrate 1, this arrangement weakens a control power with which the gate electrode 3 controls the channel region 6, and a so-called short-channel effect occurs. Consequently, the influence of a variation in lithographic processing increases.

For comparison with problems of a concave-type transistor and other conventional transistors, which will be described later, FIG. 1 shows an electric current indicated by a dot-and-dash line in FIG. 1, which is produced when the flat-type transistor is operated. A current injected from the wiring element 4a enters the source diffusion layer 5a and then its accumulation layer (corresponding to a surface portion of the diffusion layer 5a, which is opposed to the gate electrode 3 with the gate insulation film 2 interposed, and having a carrier density several tens of times as high as the active impurity concentration in the diffusion layer). The current then flows into an inversion layer of the channel region 6 and into the wiring element 4b via an accumulation layer of the drain diffusion layer 5b and a diffusion region outside the accumulation layer. The current path is thus formed.

In the diffusion region outside the accumulation layer, a high-carrier-density region on the surface of the substrate 1 is lost, and the current flows deep into the diffusion layers 5a and 5b due to the carrier density determined by the active impurity concentration, and a so-called spreading resistance occurs. However, as indicated by a dot-and-dash line in FIG. 1, a substantially linear current path is formed.

Normally, the source and drain regions are formed such that impurities of a conductivity type opposite to the conductivity type of the substrate are ion-implanted, with the gate electrode used as a mask, and the impurities are activated or diffused by a heating process. The source region and drain region serve to connect the channel with the current paths to the wiring elements. In order to effect the connection with a sufficiently low resistance value, a deep region with high concentration needs to be formed by diffusion.

FIG. 2 shows a relationship between an electron concentration distribution and impurities in the drain diffusion region 5b at the time the flat-type transistor having a gate length of 0.1 $\mu$m is operated. FIG. 2 shows, by device simulation, the area near the gate electrode 3 in FIG. 3. FIG. 2 shows only the area on the side of the drain diffusion layer 5b. In this simulation, 1V is applied to the gate electrode 3, and 1V is applied to the drain diffusion layer 5b.

A bias voltage applied to the source diffusion layer 5a is 0V. Thus, the current in the region near the source diffusion layer 5a is strongly influenced by the gate bias. In the vicinity of the drain diffusion layer 5b, the influence exerted on the surface of the substrate 1 by the gate electrode 3 is weaker than in the case of the source diffusion layer 5a, because of the bias voltage applied to the drain diffusion layer 5b. However, since the gate insulation film 2 is very thin, the current even near the drain diffusion layer 5b is strongly influenced by the gate electrode 3. The following description is mainly directed to the drain diffusion layer 5b, but the relationship between the electron density/current density distribution and the position of the gate electrode 3 or the diffusion layer impurity distribution is basically applicable to the source diffusion layer 5a.

The drain diffusion layer 5b extends to a location below or inside the gate electrode 3 to effect connection with the channel, thus forming a pn junction with channel impurities. The position of the pn junction is indicated by a bold line in FIG. 2. At the position of the pn junction, impurities of opposite conductivity types cancel each other and the net impurity concentration becomes substantially zero.

Specifically, even if high-concentration impurities of about $1 \times 20^{20}$ cm$^{-3}$ are introduced in the drain diffusion layer 5b, as indicated by a broken line in FIG. 2, the impurity concentration in the vicinity of the edge of the gate electrode 3 generally decreases due to diffusion, and the impurity concentration in the region away from the edge near the center of the channel region further decreases toward the pn junction. A depletion layer forms near the junction, and the carrier concentration (electron density) is very low. Thus, the source diffusion layer 5a or drain diffusion layer 5b is electrically isolated from the substrate 1 of the opposite conductivity type. In FIG. 2, an electron density distribution curve represented by $\log_{10}$ (electron density)=18 is away from the junction plate, compared to an impurity concentration distribution curve represented by $\log_{10}$ (impurity concentration)=18. As is understood from this, the carrier density (electron density) is lower than the impurity concentration in the vicinity of the junction in the region of the drain diffusion layer 5b away from the surface of the substrate 1.

When the transistor is operated, an inversion layer is formed in the surface portion of substrate 1 in the channel region 6 by the voltage applied to the gate electrode 3. In FIG. 2, the region with high electron density at the surface portion of the channel region 6 is this inversion layer. On the other hand, an accumulation layer is formed in the drain diffusion layer 5b near the junction in the vicinity of the surface of the substrate 1. This accumulation layer joins the inversion layer formed in the channel region 6 in the vicinity of the junction, thus forming a current path.

In FIG. 2, it is this accumulation layer where the electron density is higher than the impurity concentration in the drain diffusion layer near the junction plane in the vicinity of the surface of the substrate 1. In the region of the drain diffusion layer 5b, which is away from the edge of the gate electrode 3 and has a high impurity concentration, the electron density is equal to the impurity concentration.

FIG. 3 shows a relationship between a current density distribution and the position of the gate electrode 3 or the impurity concentration distribution, when the same bias is applied to the same MOS transistor as in FIG. 2. On the inside region of the edge of the gate electrode 3, a region with high current density is provided near the surface of the substrate 1 by the formation of the inversion layer at the surface of the channel region 6 or the formation of the accumulation layer at the surface of the impurity region. However, on the outside of the edge of the gate electrode 3, the intensity of the electric field due to the gate electrode 3 sharply decreases. As a result, the region with high current density, biased toward the surface of the substrate 1, is lost. In addition, a low current density is distributed deep into the substrate along the region with high electron density in the drain diffusion layer 5b.

Accordingly, in the region outside the edge of the gate electrode 3, where the influence of the gate bias is small, the parasitic resistance cannot be lowered by forming an adequate accumulation layer with induction by the gate bias. Instead, it is necessary to sufficiently increase the carrier concentration determined by the impurity concentration and to form the impurity region deep into the substrate 1 in accordance with its concentration, thereby to decrease the resistance. In other words, when the parasitic resistance in the region outside the edge is to be decreased, it is imperative to sufficiently increase the impurity concentration below the edge of the gate electrode 3 and to distribute the high-impurity concentration region deep into the substrate 1.

The results shown in FIGS. 2 and 3 are of typical planer type MIS transistors. The electron density distribution and the current density distribution will vary in accordance with the impurity distribution in the drain diffusion layer or in accordance with the position of the gate electrode edge, the shape of the gate electrode near the edge, etc. In some cases, the peak position of the electron density distribution and/or current density distribution may lie not at the surface of the substrate but at a location deep in the substrate. In such cases, too, the parasitic resistance in the diffusion layer below the edge is decreased by forming an accumulation layer at the surface of the diffusion layer with the electric field of the gate electrode.

The impurity region inside the edge of the gate electrode 3 is indispensable to sufficiently increase the impurity concentration below the edge of the gate electrode 3 and to distribute the high impurity concentration deep into the substrate 1. However, due to modern miniaturization, the length of the gate electrode 3 is extremely reduced and the electric field due to the impurity distribution in the diffusion layer 5a, 5b, which is applied to the channel region 6, weakens the field applied by the gate electrode 3 to the channel region 6. Consequently, a so-called short-channel effect occurs and the yield of products further decreases.

In order to suppress the short-channel effect, efforts have been made to reduce the depth of the junction of the diffusion layer 5a, 5b. As stated above, however, in order to connect the channel region 6 and the high-impurity concentration region in the drain diffusion layer 5b with a sufficiently low parasitic resistance, it is imperative to sufficiently increase the impurity concentration below the edge of the gate electrode 3 and to distribute the high impurity concentration deep into the substrate 1. This contradicts the purpose of suppressing the short-channel effect.

A concave-type transistor was proposed as a structure for eliminating this contradiction (see, e.g. Nishimatsu et al., Groove Gate MOSFET, 8th Conf. On Solid State Device, pp. 179–183, 1976). FIG. 4A is a cross-sectional view showing a conventional concave-type transistor structure. The structural elements common to those in FIG. 1 are denoted by like reference numerals. In the conventional concave-type transistor, a source diffusion layer 45a and a drain diffusion layer 45b are formed at a level higher than the surface of a channel region formed at a bottom of a concave portion. Thereby, the influence of an impurity distribution in the diffusion layers 45a and 45b, which acts upon the control performance of a gate electrode 43 which electrically controls the channel region, is suppressed. In the concave-type transistor, the source and drain can be formed thick (deep) with a distance being kept from the channel region at the concave bottom. Thus, while the short-channel effect is being suppressed, the parasitic resistance per unit length in the source and drain diffusion layer portions can be reduced.

The ordinary concave-type transistor, however, has the following problems. FIG. 4B is an enlarged view of a main portion of the concave-type transistor in FIG. 4A. An inversion layer 46 is formed at a concave bottom surface of the silicon substrate 1, an inversion layer 47 is formed at a concave side face, and an accumulation layer 48 is formed at a concave side face in a surface portion of the diffusion layer 45a which is in contact with a gate insulation film 42. The inversion layer 46 at the concave bottom surface corresponds to the inversion layer formed at the surface portion of the channel region 46 of the flat-type transistor shown in FIG. 1.

As described above, in the ordinary concave-type transistor, in addition to the inversion layer 46 at the concave bottom surface, those regions are provided on the concave side faces, where the side channel portions and the source and drain diffusion layers 45a and 45b continuous thereto are parallel to the gate electrode 43 with the gate insulation film 42 interposed. In the region at the concave side face which is parallel to the gate electrode 43, the inversion layer 47 at the concave side face and the accumulation layer 48 at the concave side face are formed in parallel to the side face of the gate electrode 43 to constitute a current path. Consequently, a large parasitic capacitance occurs.

Comparing the current path of the flat-type transistor shown in FIG. 1 with that of the concave-type transistor shown in FIG. 4, the current path of the flat-type transistor is linear whereas the current path of the concave transistor has acute angles with the concave bottom face and the concave side face. Thus, the length of the current path to the wiring element 4a, 4b connected to the diffusion layer 45a, 45b is increased.

In normal cases, the parasitic capacitance between the gate electrode 43, or the wiring element connected to the gate electrode 43, and the wiring element 4a, 4b is suppressed, or a leak current occurring therebetween is suppressed in the following manner. That is, the distance between the gate electrode 43 and the wiring element 4a, 4b to the diffusion layer 45a, 4tb, is increased, or a side-wall insulation film 49 or a non-conductive film region is formed in contact with the gate side face on the substrate 1.

In the case of the ordinary concave-type transistor wherein the bottom surface of the side-wall insulation film 49 and the concave bottom surface are parallel, a current path having portions with nearly acute angles are formed between stepped planes of the bottom surface of the side-wall insulation film 49 and the concave bottom surface. Consequently, as compared to the case of the above-described flat-type transistor, the length of the current path increases and the parasitic resistance also increases.

In the channel periphery region, a carrier distribution peak appears in a very thin region of 0.01 μm along the channel surface. Accordingly, when the current path with nearly acute angles, i.e. the path of electrons, is present near the channel bottom surface, an excess work is required for carriers to follow an acute-angle peak distribution and the current value decreases.

On the other hand, "Ultra-Shallow in-situ-doped raised source/drain structure for sub-tenth micron CMOS", Y. Nakahara et al., pp. 174–175, 1996 Symposium on VLSI Technology Digest of Technical Papers, shows a transistor structure having a source region and a drain region with an oblique substrate surface as a conventional structure of a p-type flat-type transistor. This structure is shown in FIG. 5. The structure shown in FIG. 5 differs from that of the concave-type structure shown in FIG. 4 in that the channel region and the source/drain are formed in a flat shape. A current reaches the wiring (not shown) to the source and drain via shallow diffusion layers 55a and 55b and high-density, deep diffusion layers 55c and 55d which are in the same plane as the channel region.

Specifically, in the concave-type transistor shown in FIG. 4B, the accumulation layer 48 continuous with the inversion layer in the channel region is shallower than the channel bottom face, and thereby the diffusion layers 45a and 45b are situated apart from the channel bottom face. Thus, the short-channel effect is reduced. On the other hand, in the structure shown in FIG. 5, the accumulation layers formed in the source diffusion layer and drain diffusion layer continuous with the channel inversion layer are formed in the same plane as the inversion layer of the channel region at end portions adjacent to the channel regions of shallow diffusion layers 55a and 55b. Consequently, shallow layers 55a and 55b in FIG. 5 extend in the silicon substrate 1, adjoining the channel inversion layers, and the short-channel effect may occur depending on their thickness. In order to suppress the short-channel effect, very shallow source diffusion layer 55a and drain diffusion layer 55b are formed adjacent to the channel region with use of silicon. The thickness of the diffusion layers 55a and 55b is compensated by forming an epitaxial source diffusion layer 55e and a drain diffusion layer 55f on the silicon substrate 1. The edges of the gate electrode 53 are situated apart from the surfaces of the epitaxial diffusion layers 55e and 55f, with a nitride side wall 56 interposed, and over the shallow source diffusion layer 55a and drain diffusion layer 55b.

By virtue of this structure, while the transistor is being operated, a less influence is exerted by the electric field of the gate electrode 53 upon the current path formed in the epitaxial diffusion layers 55e and 55f. Accordingly, the current flows to wide regions in the epitaxial diffusion layers 55e and 55f with a spreading resistance. Current paths, however, are provided in parallel to the diffusion layers 55a and 55b, and a parasitic resistance of the entire source and drain is decreased.

In other words, the epitaxial diffusion layers 55e and 55f in the structure shown in FIG. 5 advantageously function to reduce the high resistance in the shallow diffusion layer 55a, 55b reading the deep, high-density diffusion layer 55c, 55d formed in the same plane as the channel bottom surface, by compensating the thickness of these regions.

Besides, since the surfaces of the epitaxial diffusion layers 55e and 55f have oblique portions, a thick oxide side wall 57 can be formed between the gate electrode 53 and the surface of the source/drain diffusion layer, with the nitride side wall 56 interposed. The parasitic capacitance is thus reduced.

However, since this transistor structure is of the flat type, the short-channel effect cannot fully be suppressed merely by controlling the thickness of the shallow diffusion layer 55a, 55b.

As has been described above, when the conventional semiconductor apparatus is used, it is not possible to suppress the short-channel effect, to reduce the parasitic capacitance or resistance, or to decrease the resistance of the current path.

BRIEF SUMMARY OF THE INVENTION

The present invention has been made in consideration of the above problems, and its object is to provide a semiconductor device and a method of fabricating the same, wherein a parasitic resistance and a parasitic capacitance are reduced and a short-channel effect is suppressed.

In order to achieve the above object, according to an aspect of the invention, there is provided a MIS type semiconductor device comprising:

a semiconductor layer provided with a recess portion having a side wall with an obtuse angle at least at a portion of the recess portion;

a gate electrode formed over a bottom surface of the recess portion, with a gate insulating film interposed;

a source region and a drain region formed on sides of the gate electrode with an insulating film interposed, such that boundary planes between the source region and the drain region, on one hand, and the insulating film, on the other hand, are formed in the semiconductor layer at an angle to a surface of the semiconductor layer; and wiring contact portions for contact with the surface of the semiconductor layer, wherein an edge of the gate electrode is located inside the recess portion provided in the semi-conductor layer, and there is provided at least one of a mutually opposed portion between the gate electrode and the source region and a mutually opposed portion between the gate electrode and the drain region, whereby at least one of a portion of the source region and a portion of the drain region, which lie in the associated mutually opposed portions, functions as an accumulation layer.

According to another aspect of the invention, there is provided a MIS type semiconductor device comprising:

a semiconductor layer provided with a recess portion having a side wall with an obtuse angle at least at a portion of the recess portion;

a gate electrode formed over a bottom surface of the recess portion, with a gate insulating film interposed;

a source region and a drain region formed on sides of the gate electrode with an insulating film interposed, such that boundary planes between the source region and the drain region, on one hand, and the insulating film, on the other hand, are formed in the semiconductor layer at an angle to a surface of the semiconductor layer; and a channel region formed under the bottom of the recess portion of the semiconductor layer, wherein the source region and the gate electrode have a first mutually opposed region at a first position of a junction between the source region and the channel region in the vicinity of the gate insulating film, the drain region and the gate electrode have a second mutually opposed region at a second position of a junction between the drain region and the channel region in the vicinity of the gate insulating film, one of the source region and the drain region, which lies in at least one of the first and second mutually opposed regions functions as an accumulation layer, and a portion of the insulating film between the gate electrode and at least one of the source region and the drain region, which lies outside an associated one of the first and second mutually opposed regions, is made thicker than the associated one of the first and second mutually opposed regions.

According to still another aspect of the invention, there is provided a MIS type semiconductor device comprising:

a semiconductor layer provided with a recess portion having a side wall with an obtuse angle at least at a portion of the recess portion;

a gate electrode formed over a bottom surface of the recess portion, with a gate insulating film interposed;

a source region and a drain region formed on sides of the gate electrode with an insulating film interposed, such that boundary planes between the source region and the drain region, on one hand, and the insulating film, on the other hand, are formed in the semiconductor layer at an angle to a surface of the semiconductor layer; and a channel region formed under the bottom of the recess portion of the semiconductor layer, wherein the source region and the gate electrode have a first mutually opposed region at a first position of a junction between the source region and the channel region in the vicinity of the gate insulating film, the drain region and the gate electrode have a second mutually opposed region at a second position of a junction between the drain region and the channel region in the vicinity of the gate insulating film, one of the source region and the drain region, which lies in at least one of the first and second mutually opposed regions functions as an accumulation layer, a portion of the insulating film between the gate electrode and one of the source region and the drain region, which lies outside an associated one of the first and second mutually opposed regions, is made thicker than the associated one of the first and second mutually opposed regions, and contact portions are provided on surfaces of the source region and the drain region at a distance from the gate electrode, a current path is formed between the source region and the associated one of the contact portions and between the drain region and the other contact portion along a boundary plane between the insulating film and the source and drain regions, and a distance between each of the contact portions and the gate electrode is less than 1.5 times the width of the gate electrode.

According to still another aspect of the invention, there is provided a method of manufacturing a MIS type semiconductor device, the method comprising the steps of:

forming a recess portion having a side wall with an obtuse angle in a semiconductor layer by an RIE process;

forming a gate insulating film covering a surface of the semiconductor layer;

forming a conductive film on the gate insulating film including the recess portion; and patterning the conductive film by a lithographic process such that the side wall is located at a side surface of the recess portion, thereby forming a gate electrode.

According to still another aspect of the invention, there is provided a method of manufacturing a MIS type semiconductor device, the method comprising:

laminating a first insulating film and a dummy gate selectively on a first semiconductor layer;

selectively growing a semiconductor material in a solid phase, with the dummy gate used as a mask, thereby forming a second semiconductor layer with an obtuse-angled side wall, the second semiconductor layer sandwiching the dummy gate;

removing the first insulating film and the dummy gate; and forming a gate insulating film and a gate electrode in succession selectively in a region where the first insulating film and the dummy gate have existed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view showing the entire structure of a conventional flat-type transistor;

FIG. 4A is a cross-sectional view showing the entire structure of a conventional concave-type transistor;

FIG. 4B is an enlarged cross-sectional view showing a main portion in FIG. 4A;

FIG. 5 is a cross-sectional view showing the entire structure of a transistor including a source region and a drain region with conventional inclined substrate surfaces;

FIG. 10A is a plan view of the entire structure of a semiconductor device according to a second embodiment of the invention;

FIG. 10B is a cross-sectional view showing the entire structure of the semiconductor device according to the second embodiment;

FIG. 10C is a cross-sectional view showing the entire structure of the semiconductor device according to the second embodiment;

FIG. 10D is a cross-sectional view showing the entire structure of the semiconductor device according to the second embodiment;

FIG. 10E is a cross-sectional view showing the entire structure of the semiconductor device according to the second embodiment;

FIG. 20A is a plan view illustrating a manufacturing step of a semiconductor device according to a sixth embodiment of the invention;

FIG. 20B is a cross-sectional view of the semiconductor device according to the sixth embodiment;

FIG. 20C is a cross-sectional view of the semiconductor device according to the sixth embodiment;

DETAILED DESCRIPTION OF THE INVENTION

Embodiments of the present invention will now be described with reference to the accompanying drawings.

(First Embodiment)

Figure 2:
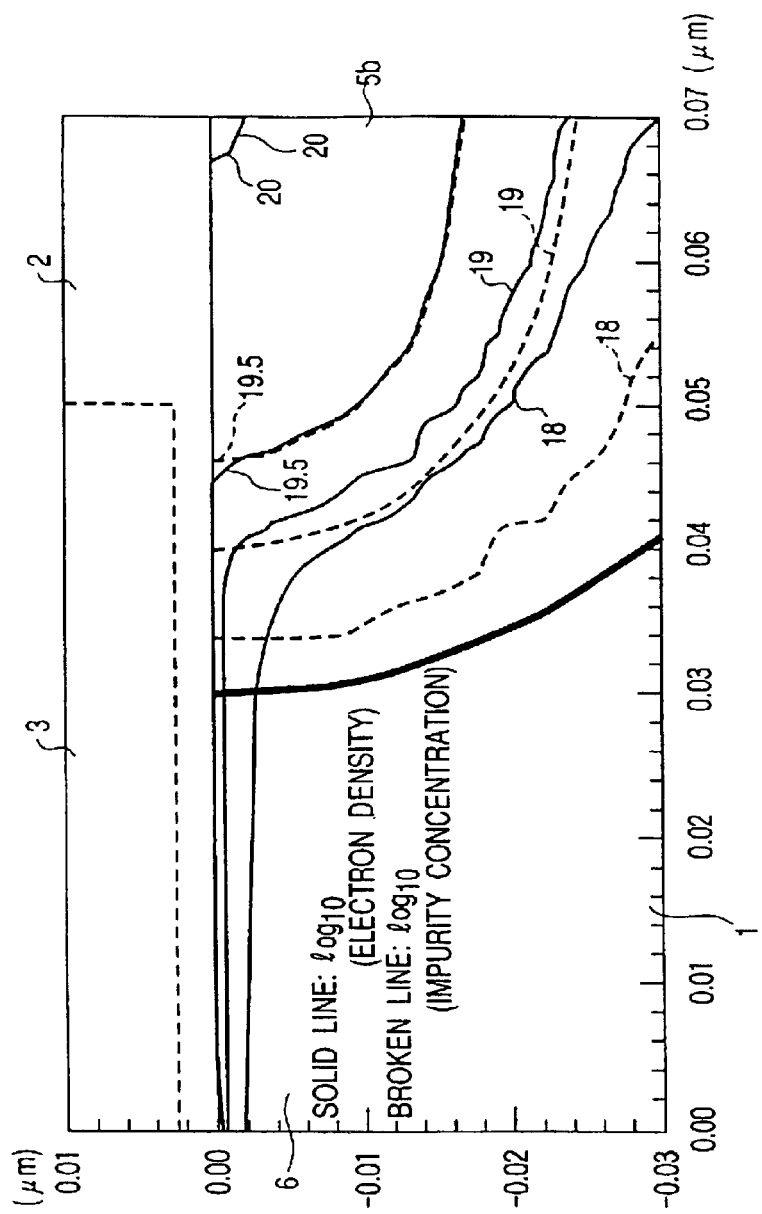
FIG. 2 shows an electron density distribution at a time when the conventional flat-type transistor operates.
Figure 3:
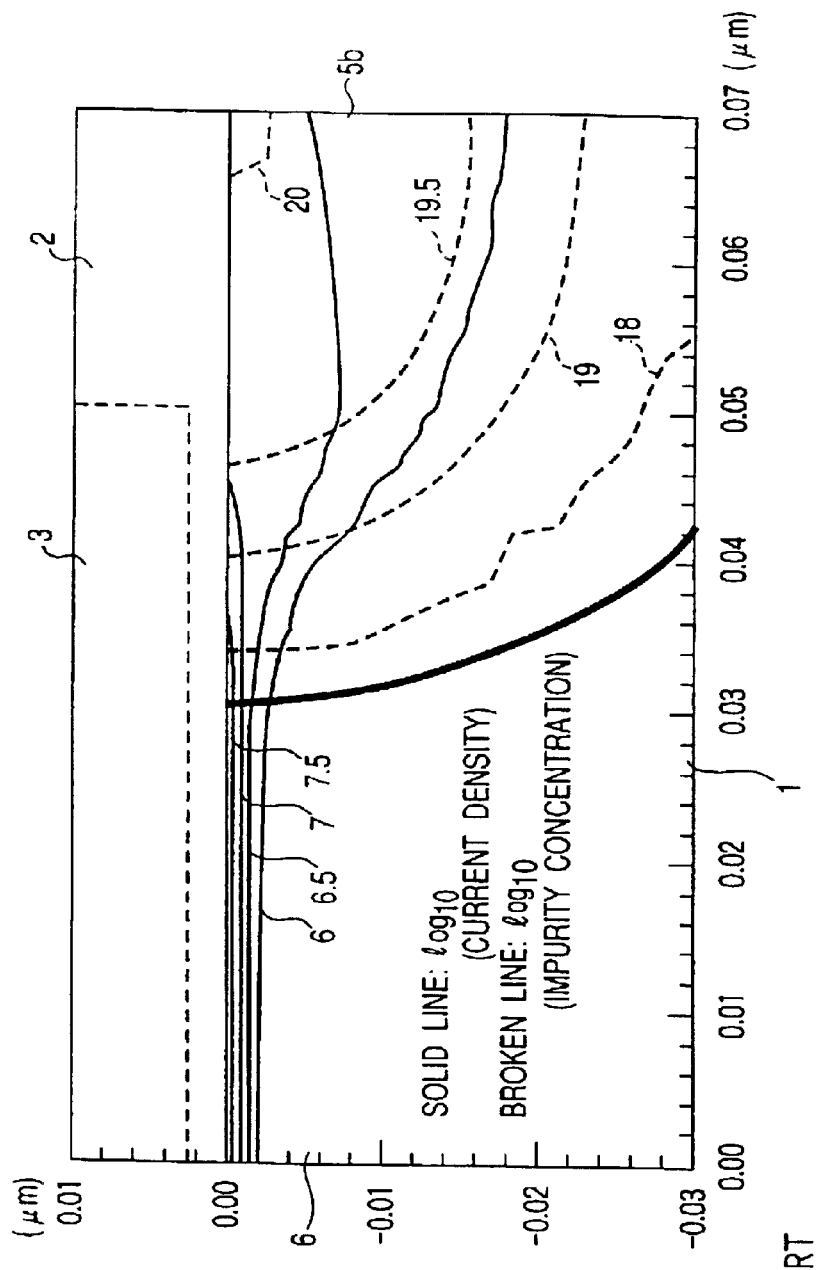
FIG. 3 shows a current density distribution in the conventional flat-type transistor.
Figure 6A:
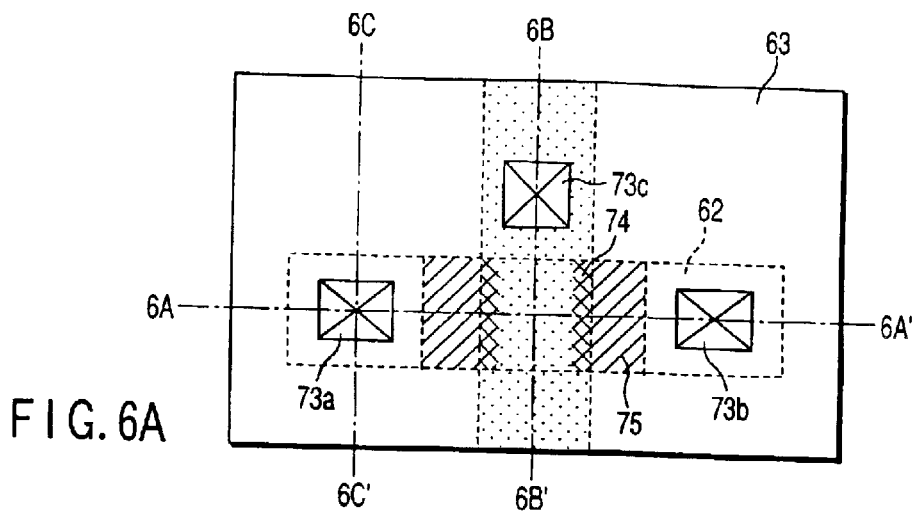
FIG. 6A is a plan view of the entire structure of a semiconductor device according to a first embodiment of the invention.

FIGS. 6A to 9 are views for describing a semiconductor device (concave-type MIS transistor) according to a first embodiment of the invention. FIGS. 6A to 6D and FIG. 9 are views for describing the structure of the semiconductor device according to this embodiment, and FIGS. 7A to 7D and FIGS. 8A to 8D are cross-sectional views showing manufacturing steps of the semiconductor device. FIG. 6A is a plan view of the semiconductor device. FIG. 6B is a cross-sectional view taken along line 6A–6A' in FIG. 6A. FIG. 6C is a cross-sectional view taken along line 6B–6B' in FIG. 6A, and FIG. 6D is a cross-sectional view taken along line 6C–6C' in FIG. 6A. This embodiment is directed to an n-channel MIS transistor. If the conductivity types of respective structural portions are reversed, the following description will apply to a p-channel MIS transistor.

Figure 6B:
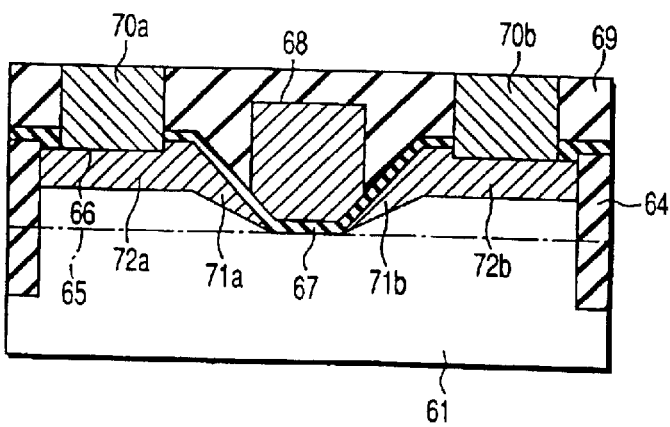
FIG. 6B is a cross-sectional view of the semiconductor device according to the first embodiment.
Figure 6C:
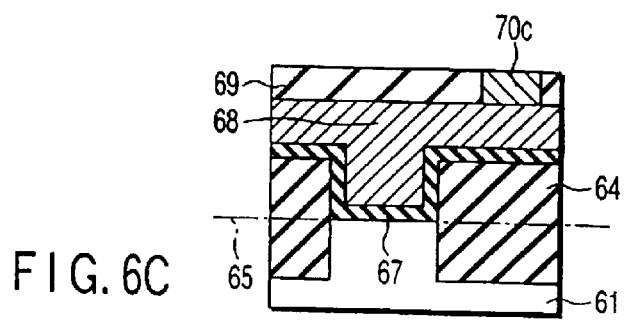
FIG. 6C is a cross-sectional view of the semiconductor device according to the first embodiment.
Figure 6D:
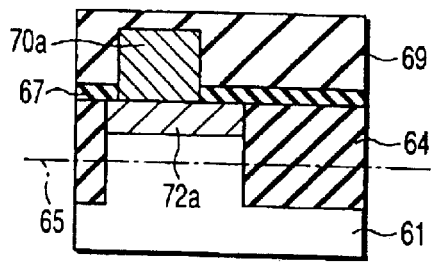
FIG. 6D is a cross-sectional view of the semiconductor device according to the first embodiment.

In FIG. 6B, numeral 61 denotes a p-type silicon substrate using a (100) plane, and its impurity concentration is about $5 \times 10^{15}$ cm$^{-3}$. The surface of the silicon substrate 61, as shown in FIG. 6A, is divided into an active region 62 and a device isolation region 63 surrounding the active region 62. A device isolation insulating film 64 is formed in the device isolation region 63.

The active region 62 is a portion enclosed by a broken line in FIG. 6A. A channel ion-implanted layer (not shown) with an impurity concentration of about $5 \times 10^{17}$ cm$^{-3}$ is formed in the active region 62 in order to control a threshold voltage ($V_{th}$). A gate electrode 68 is formed on the silicon substrate 61 in the active region 62, with a gate insulating film 67 interposed. Wiring elements 70a and 70b are provided on both sides of the gate electrode 68, with interlayer insulating film 69 interposed. The wiring elements 70a and 70b are connected to a source region and a drain region, respectively. The source region comprises a first source diffusion layer 71a and a second source diffusion layer 72a, and the drain region comprises a first drain diffusion layer 71b and a second drain diffusion layer 72b. The gate insulating film 67 is a thermal oxide film with a thickness of, e.g. about 3.0 nm.

In FIG. 6B, a channel plane 65 is located at a level deeper than a substrate surface 66. A recess portion 92 having the channel plane 65 as its bottom is formed in the silicon substrate 61. Side walls of the recess portion 92 are inclined at an angle greater than 90° (i.e. an obtuse angle) with respect to the channel plane 65. The recess portion 92 is entirely covered with the gate insulating film 67. The channel plane 65 in this context refers to an interface between the channel region and the gate insulating film 67. The channel region is formed at the bottom of the recess portion below the channel plane 65.

The gate electrode 68 is buried on the recess portion 92 of the silicon substrate 61, with the gate insulating film 67 interposed, so as to be opposed to the channel region. Thus, a concave-type transistor structure having the channel region buried in the substrate 61 is obtained.

The channel plane 65 and the substrate surface 66 which are different in level are connected by the first source diffusion layer 71a and first drain diffusion layer 71b (indicated by hatching), which are formed along the oblique side walls of the gate insulating film 67 and are inclined with respect to the surface of the silicon substrate 61, and the second source diffusion layer 72a and second drain diffusion layer 72b which are continuous with the first source diffusion layer 71a and first drain diffusion layer 71b (hereinafter elements 71a, 71b, 72a and 72b are referred to as the drain and source).

The first source diffusion layer 71a and drain diffusion layer 71b are formed to extend toward the channel plane 65. The second source diffusion layer 72a and drain diffusion layer 72b are thick diffusion layers formed in parallel to the channel plane 65.

The diffusion depth and impurity concentration of each of the second source diffusion layer 72a and second drain diffusion layer 72b are 0.05 μm and about $5 \times 10^{20}$ cm$^{-3}$, respectively.

Contact holes 73a to 73c are formed in the interlayer insulating film 69. The wiring elements 70a to 70c are put in contact with the n-type second source diffusion layer 72a, second drain diffusion layer 72b and gate electrode 68 via the contact holes 73a to 73c. The interlayer insulating film 69 is formed of, e.g. SiO$_2$. The wiring elements 70a to 70c are formed of, e.g. Al. The wiring elements 70a to 70c are formed such that the distance between the wiring element 70a, 70b and the gate electrode 68 is less than 1.5 times the width of the gate. Each of the first source diffusion layer 71a and first drain diffusion layer 71b inclined with respect to the surface of the silicon substrate 61 has at its one end a region opposed to the gate electrode 68. Each of the first source diffusion layer 71a and first drain diffusion layer 71b, including such a region, extends to the vicinity of the wiring element 70a, 70b at an angle to the surface of the silicon substrate 61. In FIG. 6A, gate electrode formation regions 74 indicated by mark (x) are regions where the inclined first source diffusion layer 71a and drain diffusion layer 71b overlap the gate electrode 68. Regions 75 indicated by hatching lines are formation regions of the first source diffusion layer 71a and drain diffusion layer 71b.

Figure 7A:
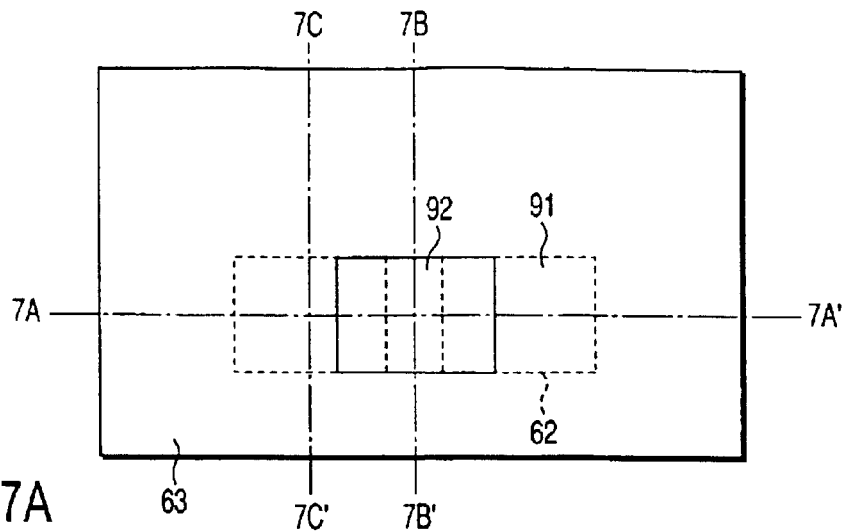
FIG. 7A is a plan view showing a manufacturing step of the semiconductor device according to the first embodiment.
Figure 7B:
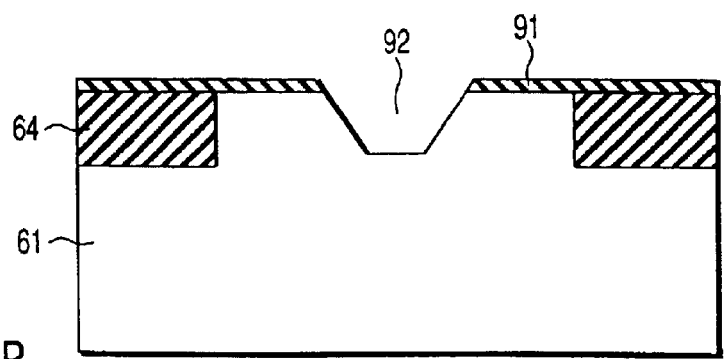
FIG. 7B is a cross-sectional view of the semiconductor device according to the first embodiment.
Figure 7C:
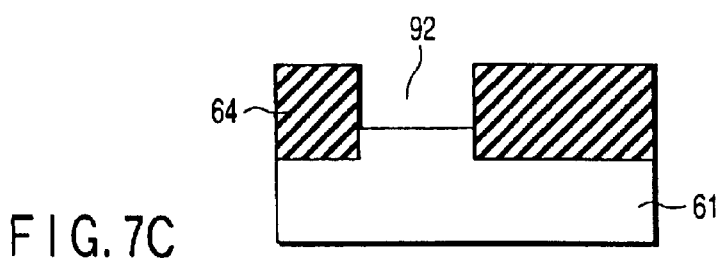
FIG. 7C is a cross-sectional view of the semiconductor device according to the first embodiment.
Figure 7D:
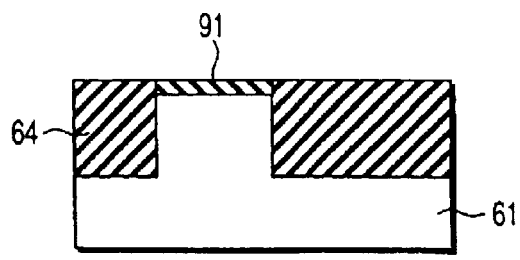
FIG. 7D is a cross-sectional view of the semiconductor device according to the first embodiment.
Figure 8A:
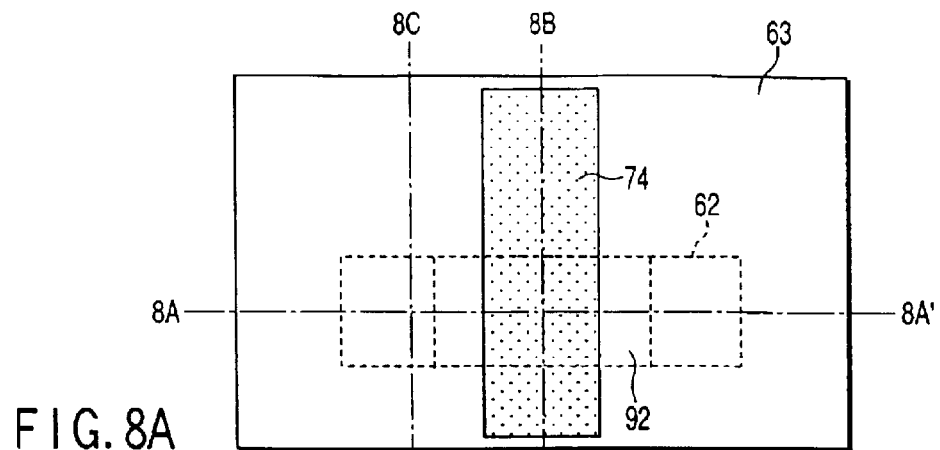
FIG. 8A is a plan view showing a manufacturing step of the semiconductor device according to the first embodiment.

A description will now be given of a method of fabricating the concave-type MIS transistor according to the present embodiment with reference to FIGS. 7A to 7D and FIGS. 8A to 8D. FIG. 7A is a plan view, FIG. 7B is a cross-sectional view taken along line 7A–7A' in FIG. 7A, FIG. 7C is a cross-sectional view taken along line 7B–7B' in FIG. 7A, and FIG. 7D is a cross-sectional view taken along line 7C–7C' in FIG. 7A. FIG. 8A is a plan view, FIG. 8B is a cross-sectional view taken along line 8A–8A' in FIG. 8A, FIG. 8C is a cross-sectional view taken along line 8B–8B' in FIG. 8A, and FIG. 8D is a cross-sectional view taken along line 8C–8C' in FIG. 8A.

An SiO$_2$ film 91 having a thickness of 0.02 $\mu$m is formed in the active region 62 on the silicon substrate 61. Using a desired photoresist pattern (not shown), those portions of the SiO$_2$ film 91 and silicon substrate 61, where the channel and the inclined first source diffusion layer 71a and first drain diffusion layer 71b are to be formed, are etched away by an RIE (reactive ion etching). Thereby, a recess portion 92 having a bottom surface at a depth of about 0.1 $\mu$m from the substrate surface 66 is formed. In this case, the conditions for RIE are selected so that side surfaces of the recess portion are inclined at 45° with respect to the recess bottom surface, as shown in FIG. 7B.

Subsequently, the polymer layer and SiO$_2$ film 91, which were produced by the etching, are removed, and the surface of the active region 62 of silicon substrate 61 is exposed. The resultant structure is heat-treated, e.g. for about two minutes at 95° C. in a hydrogen atmosphere. Thereby, a damage caused in the recess portion 92 by the RIE is repaired. Then, a sacrificial SiO$_2$ film (not shown) with a thickness of about 5 nm is formed on the exposed surface of the silicon substrate 61, for example, by a thermal oxidation method. Using the device isolation insulating film 64 or the like, or a photoresist (not shown), as a mask, channel ions for threshold voltage control are implanted in the lower silicon substrate 61 in the active region 62 including the recess portion 92. In the case of the n-type transistor, when a threshold voltage (V$_{th}$) of, e.g. about 0.2V is to be set, boron (B$^+$) is implanted with conditions of, e.g. an acceleration voltage of 5 keV and a dosage of about 5×10$^{12}$ cm$^{-2}$, and a p-type channel ion-implanted layer is formed in the channel region (not shown).

Figure 8B:
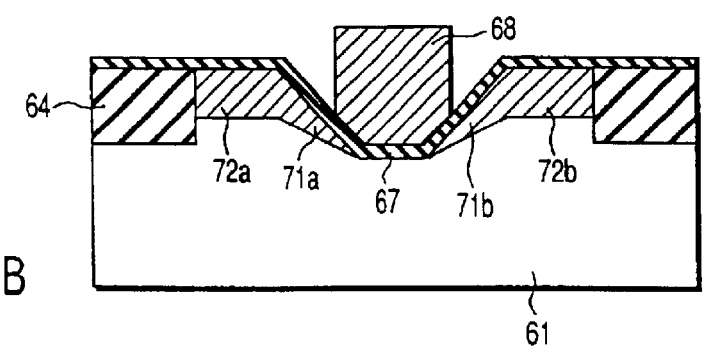
FIG. 8B is a cross-sectional view of the semiconductor device according to the first embodiment.
Figure 8C:
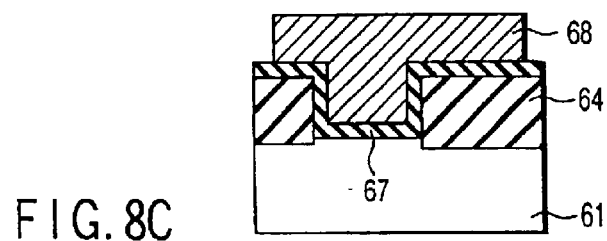
FIG. 8C is a cross-sectional view of the semiconductor device according to the first embodiment.
Figure 8D:
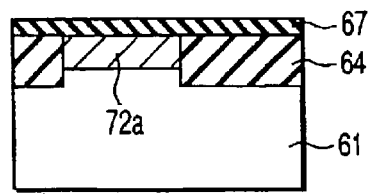
FIG. 8D is a cross-sectional view of the semiconductor device according to the first embodiment.

After the sacrificial SiO$_2$ (not shown) is removed, as shown in FIG. 8B, the gate insulating film 67 is formed by thermal oxidation on the surface of the silicon substrate 61 including the bottom surface and inclined side surfaces of the recess portion 92. In this case, a film formed by thermal-nitriding the surface of the oxide film may be substituted as the gate insulating film 67. Alternatively, a lamination film including a CVD-SiO$_2$ film, a CVD-SiON film and a CVD-Si$_3$N$_4$ may be substituted as the gate insulating film 67.

Subsequently, a conductor layer, which will become the gate electrode 68, is formed on the gate insulating film 67 such that the recess portion 92 may be filled. The surface of the conductor layer is polished and smoothed by a CMP (Chemical Mechanical Polishing) method. A polysilicon layer doped with, e.g. n-type impurities is used as the conductor layer which will become the gate electrode 68.

Then, as shown in FIG. 8B, the gate electrode 68 is formed by patterning using a lithographic technique such that both ends of the conductor layer are included inside the recess portion 92 and the source-side end and drain-side end of the conductor layer are located outside the bottom portion of the channel. Using the gate electrode 68, device isolation insulating film 64 and a photoresist as masks, ion implantation (101) is effected on the silicon substrate 61, thereby forming the first source diffusion layer 71a, first drain diffusion layer 71b, second source diffusion layer 72a and second source diffusion layer 72b. In the case of ion implantation of arsenic (As), the conditions for ion implantation are an acceleration voltage of 30 keV and a dosage of about 5×10$^{15}$ cm$^{-2}$.

When the conductor layer is patterned, the surface of the conductor layer is smoothed by the CMP method. The reason is that an error in gate pattern position set by the lithographic technique is prevented by the smoothing, and the edge of the gate electrode 68 is exactly positioned inside the recess portion 92 so as to easily form the inclined first source diffusion layer 71a and first drain diffusion layer 71b. That is, since the gate electrode 68 is used as the mask for performing the ion implantation 101 to form the first source diffusion layer 71a, first drain diffusion layer 71b, second source diffusion layer 72a and second drain diffusion layer 72b, the regions of formation of the second source diffusion layer 72a and second drain diffusion layer 72b may vary depending on the position of formation of the gate electrode 68 serving as the mask. The edge of the gate electrode 68, in this context, refers to a position where the side wall of the gate electrode 68, which is not in contact with the gate insulating film 67, intersects the gate insulating film 67.

In order to suppress the short-channel effect, the first source diffusion layer 71a and first drain diffusion layer 71b need to be formed such that no accumulation layer will form at the channel plane 65. Accordingly, the gate electrode 68 can be formed such that the edges are located at the tapered side walls of the recess portion 92. Thus, the regions 71a and 71b extend from the tapered side walls to the vicinity of both ends of the channel plane 65, and the regions 71a and 71b do not extend to the plane equal to the channel region.

In addition, since the edges of the gate electrode 68 are formed such that the edges are located outside the bottom of the recess portion 92 and include portions of the inclined side surfaces, the junction planes of the gate electrode 68 with the gate insulating film 67 in the vicinity of the edges can be obliquely formed in accordance with the inclination of the gate insulating film 67.

After the ion implantation 93 for forming the source and drain is completed, the impurities are activated by heat treatment at about 900° C. for about 10 seconds, by using, e.g. RTA (Rapid Thermal Anneal) as an activation anneal process. When the source and drain are formed, the ion implantation 93 may be replaced with solid diffusion with use of the gate electrode 68, etc. as a mask after the formation of the gate electrode 68.

As is shown in FIG. 6B, after the interlayer insulating film 69 of SiO$_2$ is formed over the entire surface, the contact holes 73a to 73c are formed in the interlayer insulating film 69 such that portions of the second source diffusion layer 72a, second drain diffusion layer 72b and gate electrode 68 are exposed. A metal film such as an Al film or an Al—Cu film is formed over the entire surface so as to fill the contact holes 73a to 73c. This metal film is patterned to successively form the wiring elements 70a to 70c (only portions shown) according to a circuit design. Then, a passivation film (not shown) is deposited over the entire surface, and the process of fabricating the transistor portion is completed.

Figure 9:
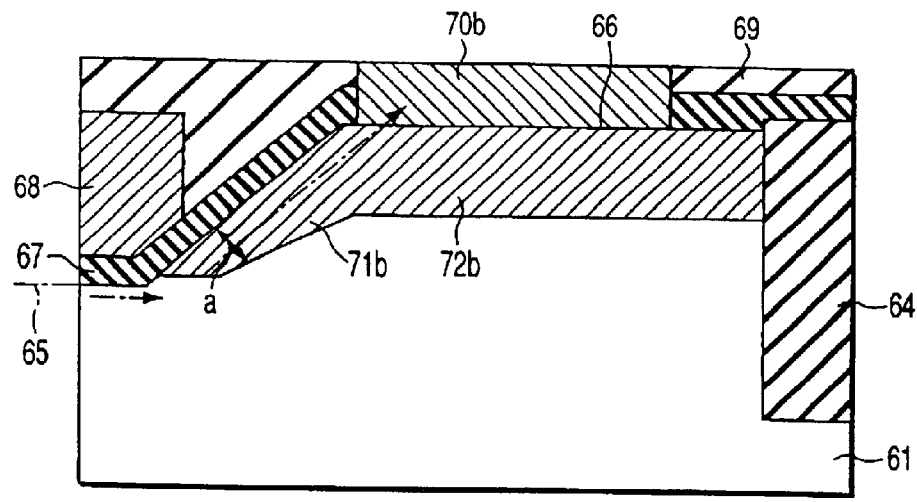
FIG. 9 is a cross-sectional view showing a main portion of the semiconductor device according to the first embodiment.

FIG. 9 is an enlarged cross-sectional view showing the vicinity of the inclined first drain diffusion layer 71b of the concave-type MIS transistor formed by the above process, as well as a current path. According to the thus formed MIS transistor with the concave-type channel configuration, a current path, which connects two stepped planes of the channel plane 65 and substrate surface 66 via the inversion layer and accumulation layer formed along the inclined side surface of the recess portion, forms an obtuse angle to the direction of the current path extending from the channel surface 65 to the vicinity of the substrate surface 66.

The surfaces of the regions where the inclined first source diffusion layer 71a and first drain diffusion layer 71b are opposed to the gate electrode 68 serve as accumulation layers. At one end portion of the accumulation layer, the source/drain forms a junction with the channel region. The net impurity concentration in this end portion is low. Accordingly, the carrier density determined by the impurity concentration is low. However, the accumulation layer stores many carriers, the density of which is several tens of times or more higher than the carrier density in a case where the accumulation layer is not provided. Accordingly, the carrier density in the vicinity of the junction of the first source diffusion layer 71a or first drain diffusion layer 71b is compensated, and a resistance occurring in the first source diffusion layer 71a or first drain diffusion layer 71b is eliminated. In addition, the accumulation layers are formed along the side walls of the inclined first source diffusion layer 71a and first drain diffusion layer 71b. Accordingly, as indicated by a dot-and-dash line in FIG. 9, the current path from the channel plane 65 to the contact at the surface of the silicon substrate 61 can be formed to be substantially linear, and thus the length of the current path can be reduced and the parasitic resistance decreased.

One end portion of the accumulation layer, that is, an end portion of the accumulation layer extending through the gate edge and intersecting a normal line to the surface of the gate insulating film 67 put in contact with the gate edge, is located shallower than the channel plane 65. Thus, this end portion can be located at a point having a sufficiently high impurity concentration. The resistance in this region can be reduced without causing the short-channel effect, by increasing the impurity distribution depth a in this position and at the same time by increasing the impurity distribution depth in the region outside the gate edge. The impurity depth in this context refers to an impurity distribution depth in a normal direction to the surface of the first source diffusion layer 71a or first drain diffusion layer 71b. The impurity concentration integrated along the impurity distribution depth a should preferably be $1 \times 10^{13}$ cm$^{-2}$ or more in order to reduce the resistance. In addition, since this end portion of the accumulation layer is located shallower than the channel bottom, no short-channel effect occurs even if impurities are distributed deeper than this location and the resistance of the region outside the gate edge is lowered.

In the regions other than the accumulation layers, the parasitic capacitance can be reduced since the distance between the first source diffusion layer 71a and gate electrode 68 and the distance between the first drain diffusion layer 71b and gate electrode 68 can be increased. Moreover, since the first source diffusion layer 71a and first drain diffusion layer 71b are formed shallower than the channel plane 65 in the concave-type transistor configuration, the short-channel effect resulting from the formation of the source and drain in the same plane as the channel can be suppressed. In the concave-type transistor structure, the lower surfaces of the source and drain, in particular, at positions away from the gate electrode 68, are located higher than the channel. Thus, the short-channel effect can be further suppressed.

If the lower end portions of the gate electrode 68, which adjoin the source and drain, are inclined in a linear or curved shape, as shown in FIG. 9, the carrier density of the inversion layers or accumulation layers, which are formed near the source and drain at both sides of the gate by the electric field of the gate, can be increased. Thus, the resistance at the channel region near both ends of the gate and the end portions of the source and drain can be decreased. Since the current path from the channel plane 65 to the source and drain is formed at an obtuse angle by this carrier distribution, the amount of work, which would be lost if electrons flow in an acute path, can be reduced and also the decrease in current value is reduced.

If the junction depth at the lower ends of the inclined first source diffusion layer 71a and first drain diffusion layer 71b is kept shallower than the channel plane 65 and the junction depth of the second source diffusion layer 72a and second drain diffusion layer 72b is increased, the resistance in the source and drain is further reduced.

It is not necessary that the regions, where the first source diffusion layer 71a is opposed to the gate electrode 68 and where the first drain diffusion layer 71b is opposed to the gate electrode 68, are formed at an obtuse angle to the silicon substrate 61. For example, the same advantages as in the present invention can be obtained even if the surfaces of the first source diffusion layer 71a and first drain diffusion layer 71b are formed so as to extend substantially vertical to the surface of silicon substrate 61 along with the gate insulating film 67 in the vicinity of the bottom of the gate electrode 68 and to extend gradually away from the gate electrode 68 from positions at a predetermined distance from the bottom portion of the gate electrode 68. In the present embodiment, the edge of the gate electrode 68 is located inside the recess portion 92. However, the edge of the gate electrode 68 may be located at the boundary between the recess portion 92 and the region outside the recess portion 92. Besides, the junction between the source and channel region or the junction between the drain and channel region in the vicinity of the gate insulating film 67 may be located just below the edge of the gate electrode 6.

(Second Embodiment)

FIGS. 10A to 10E are cross-sectional views illustrating steps of manufacturing a transistor structure according to a second embodiment of the invention, wherein the transistor structure has a channel bottom surface with a radius of curvature. In this embodiment the distance between the gate electrode and the contact portion on the mask plane is zero and the contact portion is formed on the inclined source/drain in a self-alignment manner with respect to the gate electrode.

A description will now be given of a method of manufacturing a concave-type MIS transistor according to the present embodiment.

A SiO$_2$ film 91 which is 0.02 µm thick is formed on a silicon substrate 61 in an active region. An Si$_3$N$_4$ film 101 which is 0.5 µm thick is then deposited. Using a desired photoresist pattern (not shown) as a mask, an opening is formed in the $Si_3N_4$ film 101. Subsequently, as shown in FIG. 10A, using the $Si_3N_4$ film 101 as a mask, the silicon substrate 61 is etched by RIE. Thus a recess portion 102 is formed. By virtue of the formation of the recess portion 102, source and drain regions leading to the contact portions can be formed higher than the channel region.

Subsequently, an $SiO_2$ film 103 is deposited so as to fill the recess portion 102. Using the $Si_3N_4$ film 101 as a stopper, the upper surface of the structure is flattened by CMP. A resist pattern is formed by lithography with use of a photoresist, and the resist pattern is used as a mask to etch away that portion of the $SiO_2$ film 103, which lies in the formation region of the gate electrode, by means of RIE. Further, as shown in FIG. 10B, the silicon substrate 61 is etched at the bottom of the opening to form a recess portion 104. In this case, the conditions for etching are controlled so that the recess portion 104 has a substantially uniform radius of curvature. A polymer layer (not shown) which has formed at the time of etching is removed and the surface of the silicon substrate 61 is exposed. For example, in a hydrogen atmosphere at 800° C., the resultant structure is subjected to heat treatment for about two minutes, and damage in the recess portion 104 due to the RIE is repaired. In this case, if the structure is subjected to heat treatment for one minute in a hydrogen atmosphere at 950° C. at 10 torr, it is possible to move silicon atoms on the surface of the recess portion 104 due to a balance in surface energy and to make the radius of curvature of the recess portion more uniform. If necessary, a sacrificial $SiO_2$ film (not shown) about 5 nm thick may be formed by, e.g. a thermal oxidation method on the exposed surface of the silicon substrate 61 and channel ion implantation is performed for threshold voltage control, etc.

Thereafter, the sacrificial $SiO_2$ film is removed and an $SiO_2$ film about 3 nm thick, for example, is formed as a gate insulating film 105.

A conductor film is deposited to fill the recess portion 104 surrounded by the $SiO_2$ film 103. The conductor film is formed, for example, polysilicon heavily doped with phosphorus. Then, using the $Si_3N_4$ film 101 as a stopper, the surface is flattened by CMP and a gate electrode 68 is formed, as shown in FIG. 10C. Subsequently, the $Si_3N_4$ film 101 is removed by a hot phosphoric acid process, the $SiO_2$ film 103 is removed by a fluoric acid process, and surface portions of the silicon substrate 61, which become the surfaces of source and drain regions adjacent to the gate electrode 68, are exposed. Using the gate electrode 68 as a mask, a first source diffusion layer 106a and a first drain diffusion layer 106b are formed in a self-alignment manner at both ends of the gate by ion implantation. Anneal is then performed to activate the impurities in the first source diffusion layer 106a and first drain diffusion layer 106b.

In the next step in FIG. 10D, an $Si_3N_4$ film about 0.04 µm thick, for example, is deposited on the surface, and then the $Si_3N_4$ film is partially removed by a so-called sidewall-leaving process using RIE. Thus, sidewall nitride films 107 are formed on side surfaces of the gate electrode 68. The thickness of the sidewall nitride film 107 is determined such that an end portion of the nitride film 107, which is not in contact with the gate electrode 68, is rounded by the inside of the recess portion 102.

Thereafter, using the sidewall nitride film 107 as a mask, ion implantation is performed to form a second source diffusion layer 108a and a second drain diffusion layer 108b. Thereby, the resistance of the source and drain can be decreased. If the resistance of the first source diffusion layer 106a and first drain diffusion layer 106b is sufficiently low, there is no need to form the second source diffusion layer 108a and second drain diffusion layer 108b.

Subsequently, an interlayer insulating film 69 of $SiO_2$ is deposited on the entire surface, and then the surface is flattened by CMP using the gate electrode 68 as a stopper. Following the above, an upper portion of the gate electrode 68 is etched away by CDE by about 0.1 µm, and an $Si_3N_4$ film is deposited to fill a groove at the upper part of the etched gate electrode 68. Then, the surface is flattened by CMP, and a protection nitride film 109 is formed. Subsequently, contact holes leading to the first source diffusion layer 107a and first drain diffusion layer 107b are formed by RIE. Since the sidewall nitride films 107 and protection nitride film 109 are formed, the RIE can be performed while the distance between the gate electrode 68 and the contact holes on the mask plane is set at zero.

In the following step, a conductor material, e.g. polysilicon, is filled in the contact holes to form wiring elements 110a and 110b. In order to reduce the contact resistance, Ti, etc. may be deposited on the surface of the silicon substrate 61 at the bottoms of the wiring elements 110a and 110b, thereby to convert silicon into a silicide.

When the contact resistance of the source and drain is to be reduced by the formation of the silicide, the surface portion of the silicon substrate 61 is converted into the silicide. Consequently, the bottom of the silicide portion lies close to the diffusion layer and leak current may increase. It is thus necessary to form a sufficiently deep diffusion layer in order to form the silicide. In general, if a shallow junction is formed to reduce the short-channel effect, it is difficult to meet this condition. Since the source and drain are inclined and located above the channel region in this invention, the depth of the source/drain can be increased and the contact resistance can easily be decreased by the formation of silicide.

As has been described above, according to the present embodiment, the recess portion defining the interface between the channel region and the gate insulating film is curved so that the current path, if locally observed, may become substantially linear. Accordingly, the current path can be shortened, and compared to the structure with an angular current path, the withstand voltage of the gate insulating film 105 is increased and degradation in electron mobility is prevented.

In addition, since the accumulation layers in the source and drain continuous with the channel region are inclined and located above the channel region, the short-channel effect can be suppressed.

A description will now be given of the advantage obtained by making uniform the radius of curvature of the channel region formed in the recess portion.

Where a region with a radius of curvature less than that of the peripheral portion lies in the channel region, a stronger electric field due to the gate electrode acts in that region than in the peripheral region having the greater radius of curvature. Consequently, the amount of carriers induced in the inversion layer decreases and the resistance increases. On the other hand, where the entire channel region has a uniform radius of curvature, the amount of carriers decreases throughout the channel region. Thus, by decreasing the impurity concentration in the substrate throughout the entire channel region, the amount of carriers can be generally increased. Specifically, in the case of the concave-type transistor having the uniform radius of curvature, the resistance thereof is lower than in the concave-type transistor having a portion with a small radius of curvature or an angular portion. Moreover, the substrate impurity concentration can be set at a low value. The low substrate impurity concentration is advantageous in suppressing a junction leak current between the substrate and the drain diffusion layer.

Furthermore, in the present embodiment, the contract portions are formed in a self-alignment manner, with the distance between the gate and contact on the mask set at zero. Thereby, the area for forming the transistor can be greatly reduced.

(Third Embodiment)

Figure 11:
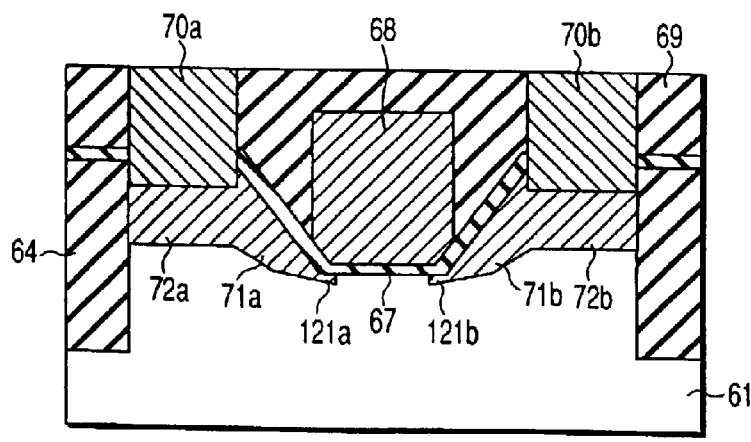
FIG. 11 is a plan view of the entire structure of a semiconductor device according to a third embodiment of the invention.

FIG. 11 is a cross-sectional view showing the whole structure of a semiconductor device according to a third embodiment of the present invention. The semiconductor device of this embodiment is a modification of the first embodiment, wherein impurity regions 121a and 121b are added to the first source diffusion layer 71a and first drain diffusion layer 71b by controlling the conditions for the ion implantation 101 shown in FIG. 8B (first embodiment) or the subsequent activation anneal.

As is shown in FIG. 11, corner portions of the channel plane 65 are covered by the first source diffusion layer 71a and first drain diffusion layer 71b, and thus the impurity regions 121a and 121b covering the corner portions are formed. In this structure, the carrier density of the corner portions of the channel plane 65, which are continuous with the accumulation layers formed in the first source diffusion layer 71a and first drain diffusion layer 71b at the end portions of the gate, is increased. Accordingly, the value of the current flowing when the transistor is operated is further increased.

The junction depth of each of the impurity region 121a and 121b with respect to the channel plane 65 may be set at a value corresponding substantially to the thickness of the inversion layer, e.g. 0.01 μm or less. When the transistor is operated, sufficient carriers are induced by the electric field of the gate electrode 68 into the surface portions of the impurity regions 121a and 121b which are opposed to the gate electrode 68 with the gate insulating film 67 interposed, whereby accumulation layers are formed and a current path with low resistance is formed. Accordingly, the junction depth of the impurity region 121a, 121b with respect to the channel plane 65 can be decreased, as compared to the conventional flat-type transistor shown in FIG. 1 wherein the junction depth of about 0.02 μm in the substrate 1 is assumed in order to form the current path. Thus, the current value can be increased while the short-channel effect is suppressed.

As has been described above, very shallow n-type impurity regions 121a and 121b with a thickness corresponding substantially to the thickness of the inversion layer are additionally formed to cover the corner portions of the channel region which are continuous with the inclined first source diffusion layer 71a and first drain diffusion layer 71b formed at both ends of the channel region. Thereby, the same advantages as in the first embodiment can be obtained, the carrier density at the corner portions can be increased, compared to the case of the first embodiment, and a higher current value is attained.

(Fourth Embodiment)

FIG. 12A to FIG. 17D show steps of fabricating a semiconductor device (concave-type MIS transistor) according to a fourth embodiment of the present invention. The fourth embodiment relates to a manufacturing process for realizing a structure having features of the concave-type MIS transistor structure according to the first embodiment shown in FIG. 6B. The fourth embodiment differs from the first embodiment in that epitaxial regions are provided on those parts of the silicon substrate 61, which are not covered with the bottom of the gate electrode 68. The epitaxial regions are formed of single-crystal silicon by selective epitaxial growth such that these regions may have tapered surfaces inclined to side surfaces of the gate electrode 68. The inclined surfaces portions of the epitaxial regions are used as the inclined source and drain.

The method of fabricating the concave-type MIS transistor of this embodiment will now be described with reference to FIGS. 12A to 17D. FIGS. 12A, 13A, 14A, 15A, 16A and 17A are top views of the semi-conductor device; FIGS. 12B to 17B are cross-sectional views taken along lines 12A–12A' to 17A–17A'; FIGS. 12C to 17C are cross-sectional views taken along lines 12B–12B' to 17B–17B'; and FIGS. 12D to 17D are cross-sectional views taken along lines 12C–12C' to 17C–17C'.

Figure 12A:
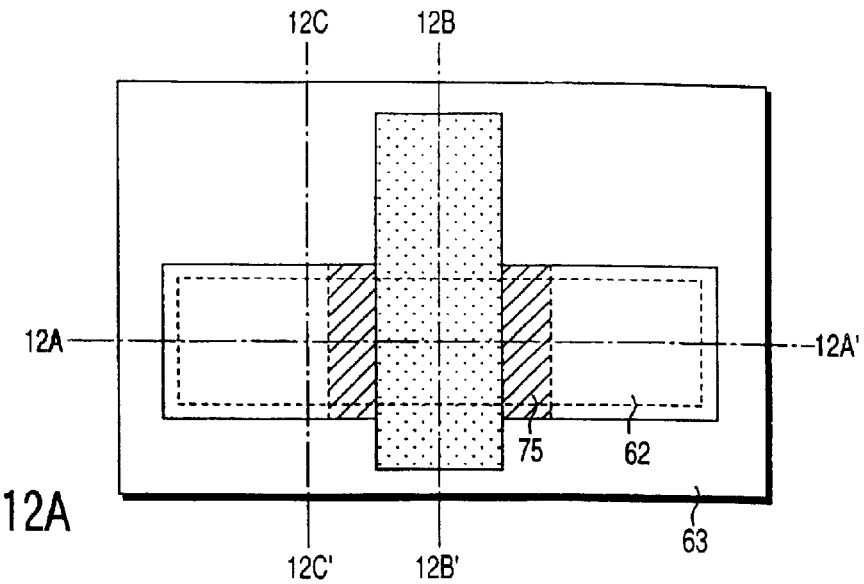
FIG. 12A is a plan view illustrating a manufacturing step of a semiconductor device according to a fourth embodiment of the invention.
Figure 12B:
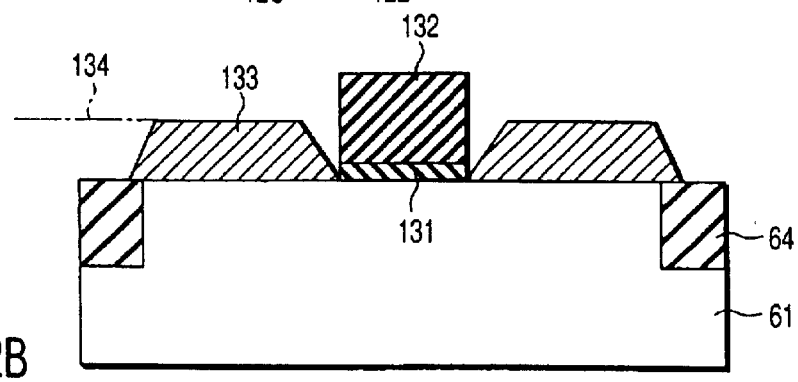
FIG. 12B is a cross-sectional view of the semiconductor device according to the fourth embodiment.
Figure 12C:
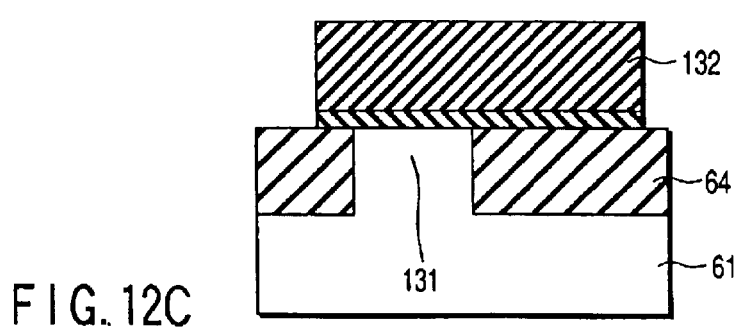
FIG. 12C is a cross-sectional view of the semiconductor device according to the fourth embodiment.
Figure 12D:
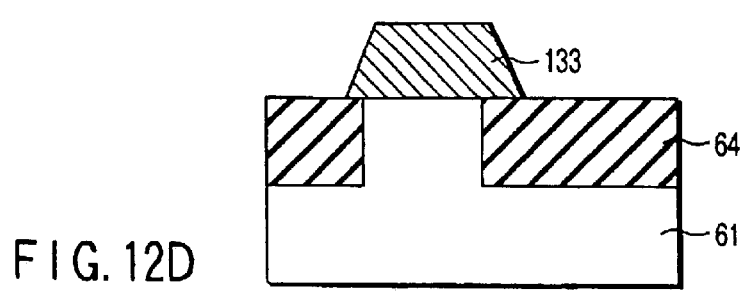
FIG. 12D is a cross-sectional view of the semiconductor device according to the fourth embodiment.

As is shown in FIG. 12B, an $SiO_2$ film 131 is formed on the entire surface of the active region 62 by means of, e.g. a thermal oxidation process. Using lithography, a dummy gate 132 of an $SiN_4$ film is formed on a region where the gate electrode 68 is to be formed. The oxide film on that part of the active region 62, which is not covered with the dummy gate 132, is removed with use of, e.g. diluted fluoric acid. In FIG. 12B, numeral 131 denotes an $SiO_2$ film left under the dummy gate 132.

Using the dummy gate 132 as a mask, a crystalline silicon layer is epitaxially grown selectively with the silicon substrate 61 used as a nucleus. When a solid-phase growth is performed on a surface on which a substance such as dummy gate 132, which cuts off a distribution of silicon crystals serving as nuclei, is present, vertical continuous growth does not occur at end portions of the silicon region and inclined surfaces, generally called "facets", will form. In the case of the present embodiment, making use of the fact that the (111) plane in the silicon crystal has a least surface energy and a slowest growth rate, facets with the (111) plane which form an angle of about 50° to the surface of the silicon substrate 61 are used.

Specifically, in an LPCVD (Low-Pressure Chemical Vapor Deposition) apparatus, the surface of the silicon substrate 61 with the exposed active region 62 is annealed, e.g. in a hydrogen atmosphere at 900° C. for 180 seconds. Thereby, a natural oxide film on the surface of the substrate is removed. Subsequently, in the same chamber, amorphous silicon is deposited on the entire surface, e.g. for 28 seconds at 600° C. at 100 Torr, with a flow rates of 10 slm of hydrogen gas and 1 slm of $SiH_4$ gas.

Further, in the same chamber, single-crystal silicon is annealed for 80 seconds at 600° C. in an $H_2$ atmosphere and grown in solid phase. The silicon single crystal on the substrate surface serves as a nucleus and the amorphous silicon becomes single-crystal silicon. At this time, the portions in contact with the surfaces of $SiO_2$ film 131 and dummy gate 132 do not become single crystals, and side walls inclined at 50° to the surface of silicon substrate 61 are formed to extend from the end portions of the $SiO_2$ film 131 and dummy gate 132.

In this way, the epitaxial silicon regions are selectively formed on the surface of the silicon substrate 61 at an angle to the silicon substrate 61 in a self-alignment manner in relation to the formation region of the dummy gate 132. The portions, which did not become single crystals and remain as amorphous silicon, are removed by a mixed acid of fluoric acid and nitric acid, and selective-growth epitaxial regions 133 shown in FIG. 12b are formed.

Figure 13A:
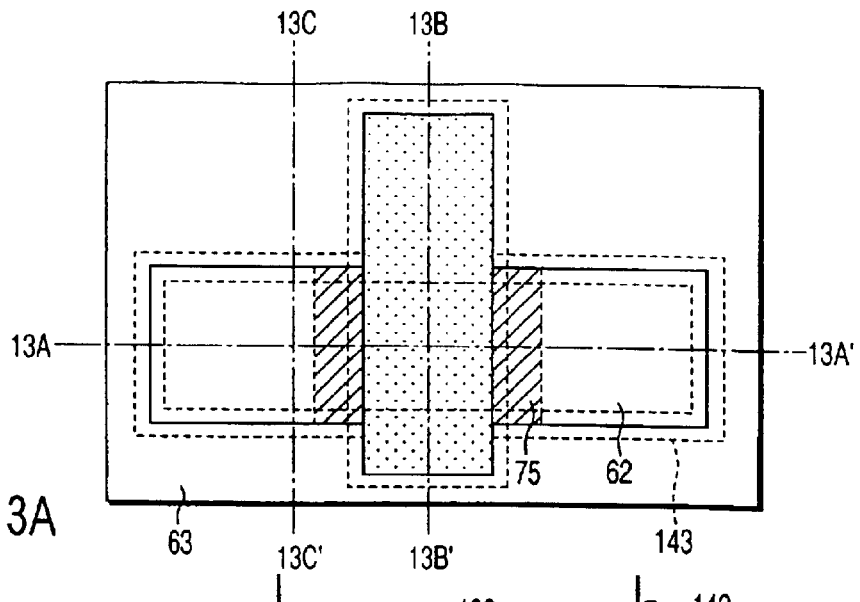
FIG. 13A is a plan view illustrating a manufacturing step of a semiconductor device according to the fourth embodiment of the invention.
Figure 13B:
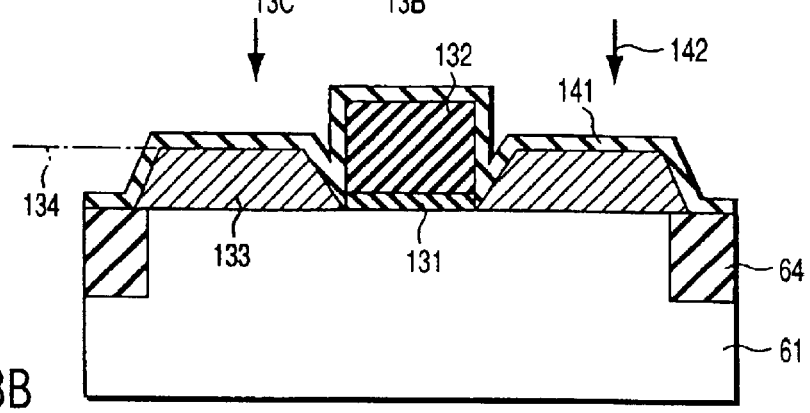
FIG. 13B is a cross-sectional view of the semiconductor device according to the fourth embodiment.
Figure 13C:
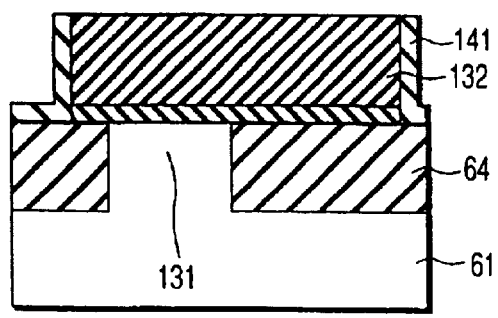
FIG. 13C is a cross-sectional view of the semiconductor device according to the fourth embodiment.
Figure 13D:
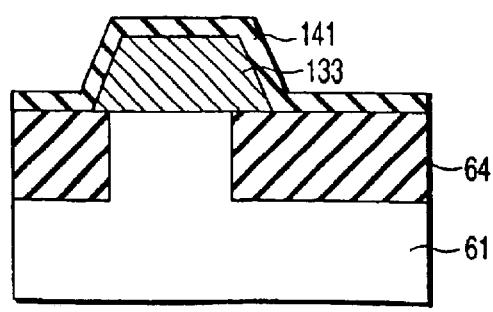
FIG. 13D is a cross-sectional view of the semiconductor device according to the fourth embodiment.

Subsequently, as shown in FIG. 13B, an $SiO_2$ film 141 with a thickness of, e.g. 10 nm is formed by CVD to cover the selective-growth epitaxial regions 133 and dummy gate 132. The $SiO_2$ films 141 on the epitaxial regions 133 will serve as protection films for ion-implantation 12 in the next step. On the other hand, the $SiO_2$ films 141 on the regions, where the lower end portions of the dummy gate 132 come in contact with the end portions of the epitaxial regions 133, will serve to form, on the inclined source and drain, source- and drain-side end portions of the gate electrode 68 which are to be formed on the basis of a difference in thickness with the gate insulating film 171. These $SiO_2$ films will determine the shapes of oblique gate end portions 172 shown in FIG. 16B. The active region and gate electrode formation region, which have been thickened by deposition of the $SiO_2$ films 141, are indicated by broken lines 143 in FIG. 13A.

Figure 14A:
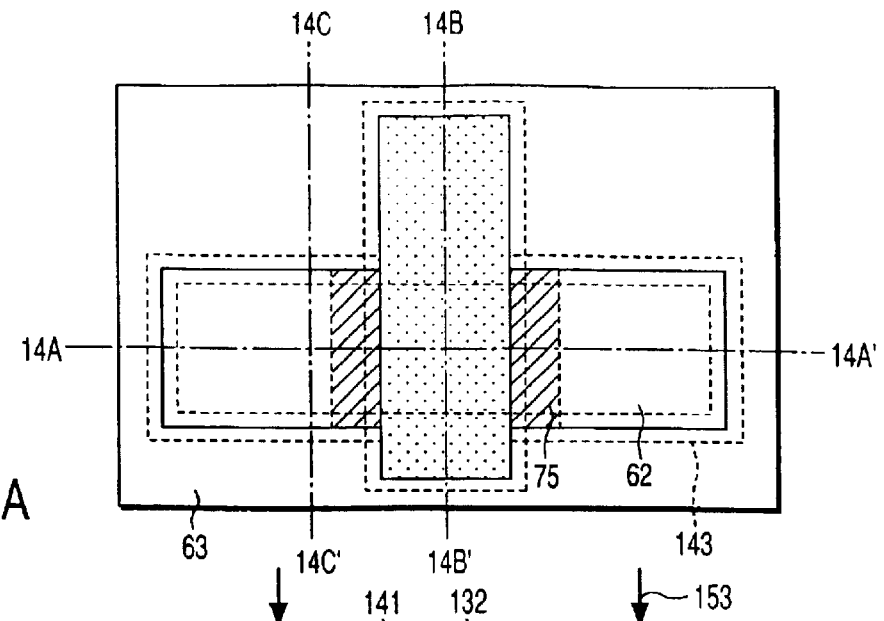
FIG. 14A is a plan view illustrating a manufacturing step of a semiconductor device according to the fourth embodiment of the invention.
Figure 14B:
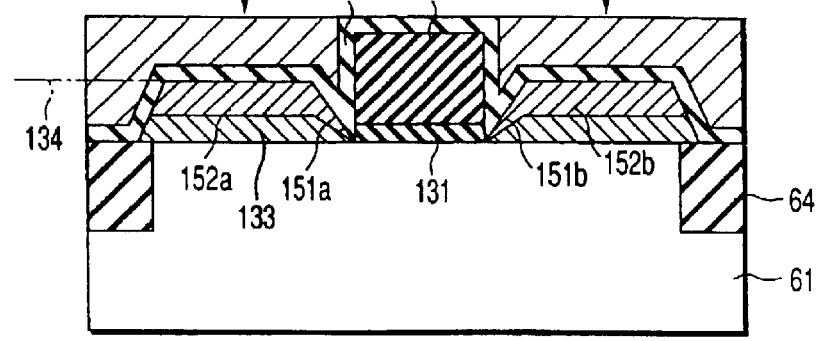
FIG. 14B is a cross-sectional view of the semiconductor device according to the fourth embodiment.
Figure 14C:
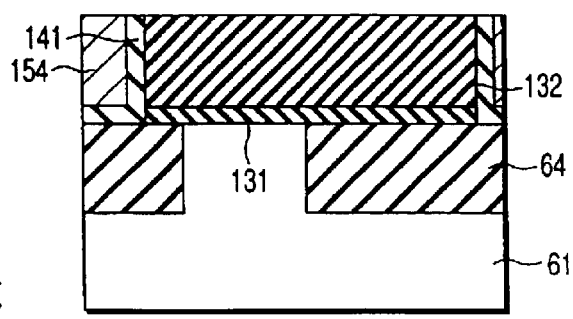
FIG. 14C is a cross-sectional view of the semiconductor device according to the fourth embodiment.
Figure 14D:
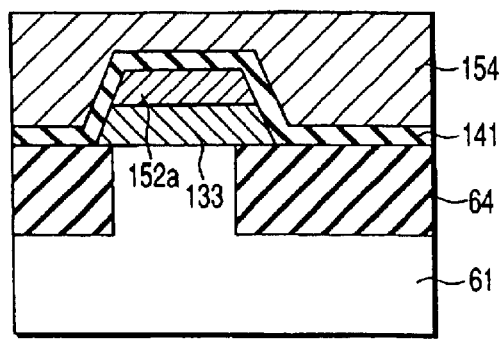
FIG. 14D is a cross-sectional view of the semiconductor device according to the fourth embodiment.

Next, ion implantation 142 of n-type impurities is performed. Following the ion implantation 142, the implanted impurities are diffused by thermal diffusion anneal at, e.g. 900° C. for 30 seconds up to regions opposed to inclined gate end portions 172 to be subsequently formed, and this anneal serves also for activation by RTA (Rapid Thermal Anneal). Thus, a second source diffusion layer 152a and a second drain diffusion layer 152b shown in FIG. 14B are formed. By performing the ion implantation 142 on the inclined surfaces of the selective-growth epitaxial regions 133, the first source diffusion layer 151a and first drain diffusion layer 151b with inclinations based on the epitaxial layer facets are simultaneously formed on the inclined surfaces of the epitaxial region 133. The conditions for the ion implantation 142 may be the same as in the first embodiment.

Thereafter, polysilicon is deposited on the surface of the entire structure. An upper portion of the polysilicon is removed by CMP 153, with the dummy gate 132 used as a stopper. Thus, a polysilicon layer 154 is formed, with an upper end of the dummy gate 132 exposed. The material deposited on the surface of the structure is not limited to polysilicon, and TEOS (Tetra Ethyl Ortho Silicate), for example, may be substituted according to the kind of material of dummy gate 132.

Figure 15A:
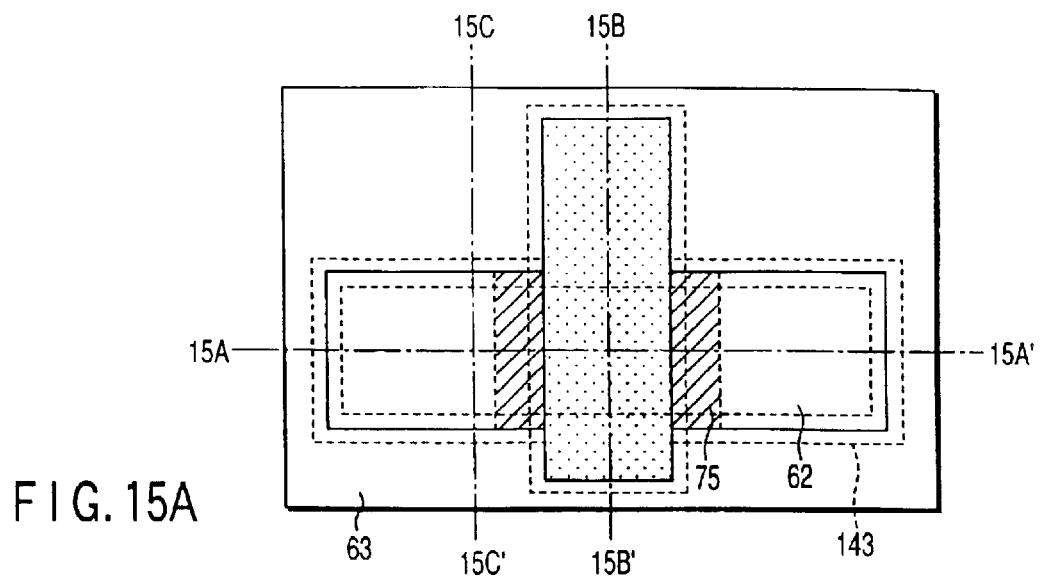
FIG. 15A is a plan view illustrating a manufacturing step of a semiconductor device according to the fourth embodiment of the invention.
Figure 15B:
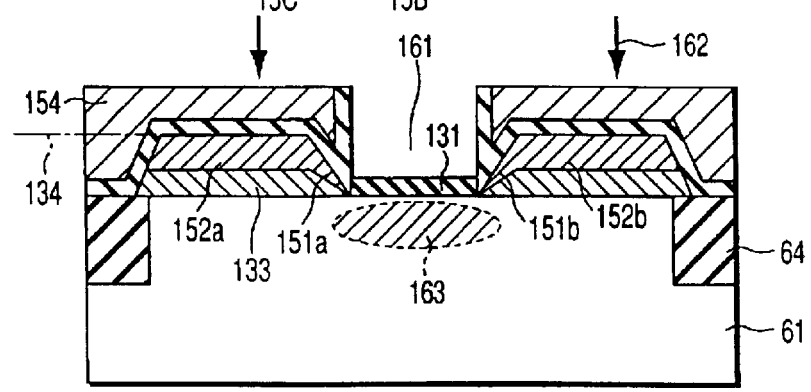
FIG. 15B is a cross-sectional view of the semiconductor device according to the fourth embodiment.
Figure 15C:
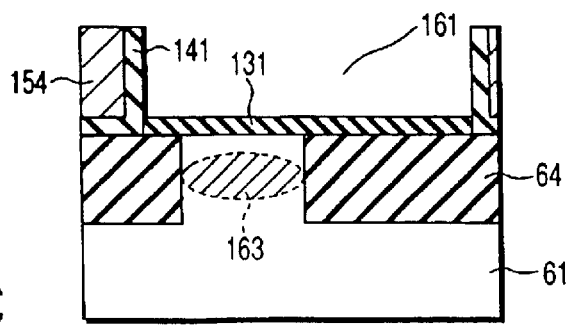
FIG. 15C is a cross-sectional view of the semiconductor device according to the fourth embodiment.
Figure 15D:
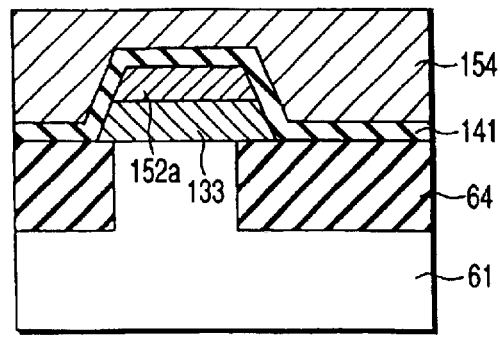
FIG. 15D is a cross-sectional view of the semiconductor device according to the fourth embodiment.

Following the above, as shown in FIG. 15B, the dummy gate 132 is removed with use of hot phosphoric acid, and a recess portion 161 corresponding to the gate electrode portion is formed. The recess portion 161 is a region where the gate insulating film 171 and gate electrode 68 are buried.

Prior to the formation of the gate electrode 68, channel ion implantation 162 for $V_{th}$ control is performed in the recess portion on an as-needed basis, with the polysilicon film 154 and photoresist used as masks. By performing the channel ion implantation 162 at this stage, an ion-implanted layer 163 can be selectively formed in the channel region. By virtue of this method, compared to the case of using non-selective channel ion implantation, the impurity concentrations of the regions, where the second source diffusion layer 152a and second drain diffusion layer 152b are formed, can be decreased, and a junction leak current in the source and drain can be reduced. In addition, the junction capacitance can be decreased.

Thereafter, the $SiO_2$ films 131 and 141 formed on the bottom surface and side walls of the recess portion 161 are removed. As a result, the recess portion 161 has tapered portions between its bottom surface and side walls with the same inclination as that of the side surface of each of the second source diffusion layer 152a and second drain diffusion layer 152b. Specifically, the distance between the side walls of the recess portion 161 increases by a degree corresponding to the thickness of the $SiO_2$ films 141 removed from the side walls of the recess portion 161.

However, since the $SiO_2$ films 141 are formed on the inclined side surfaces of the epitaxial regions 133, inclined portions of the epitaxial regions 133 are exposed by the removal of the $SiO_2$ films 141.

Figure 16A:
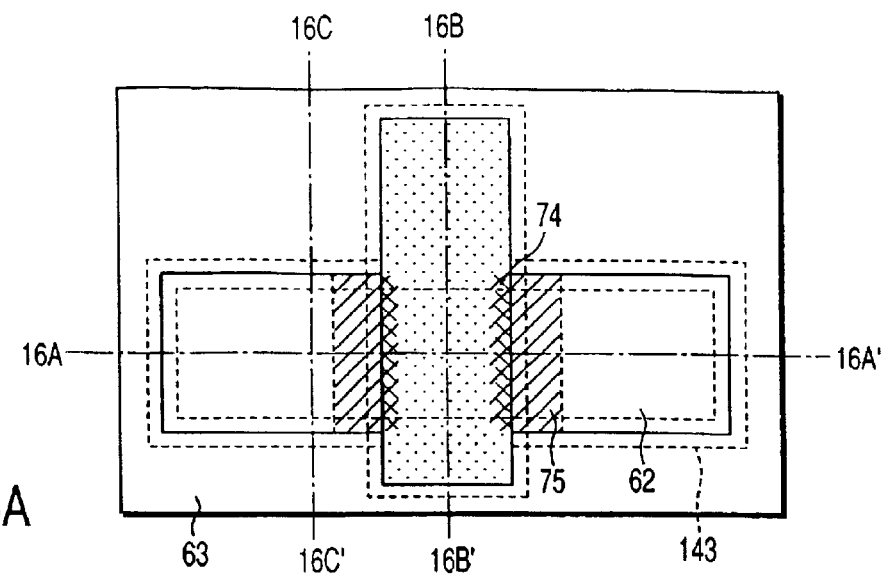
FIG. 16A is a plan view illustrating a manufacturing step of a semiconductor device according to the fourth embodiment of the invention.
Figure 16B:
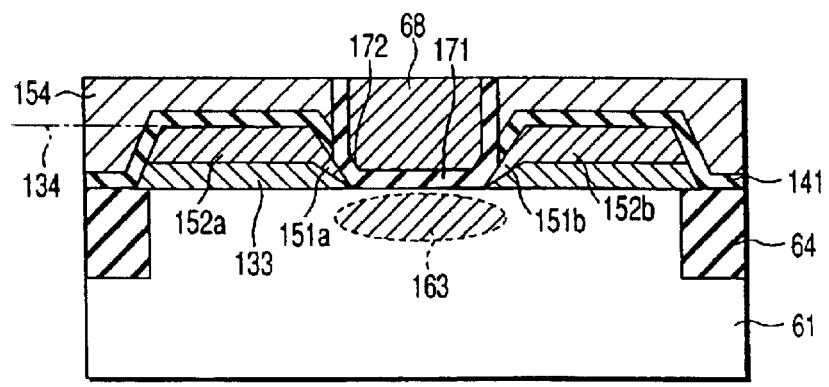
FIG. 16B is a cross-sectional view of the semiconductor device according to the fourth embodiment.
Figure 16C:
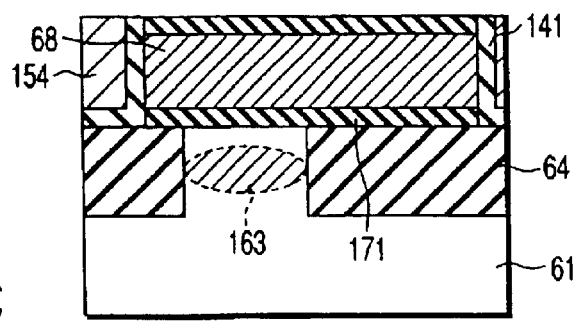
FIG. 16C is a cross-sectional view of the semiconductor device according to the fourth embodiment.
Figure 16D:
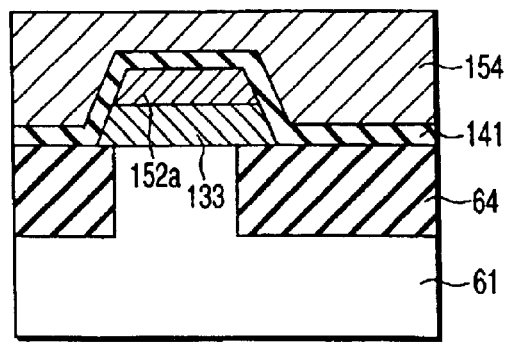
FIG. 16D is a cross-sectional view of the semiconductor device according to the fourth embodiment.

Then, as shown in FIG. 16B, gate insulating films 171 are formed in the recess portion 161 by means of, e.g. thermal oxidation. The gate insulating films 171 may be lamination films including a CVD-$SiO_2$ film, a CVD-SiON film and a CVD-$Si_3N_4$. The gate insulating film 171 is thinner than the $SiO_2$ film and formed of, e.g. an $SiO_2$ film 3.5 nm thick. Since the gate insulating films 171 are formed thinner than the $SiO_2$ films 141, gate end portions 172 having the same inclinations as the side surfaces of the regions 151a and 151b can be formed at the boundary planes between the gate insulating film 171 and the first source diffusion layer 151a and between the gate insulating film 171 and first drain diffusion layer 151b.

A conductive film is deposited on the entire surface so as to fill the recess portion 161, thereby to form the gate electrode 68. Then, the portion of the conductive film, which is present outside the recess portion 161, is polished and removed by the CMP. The first source diffusion layer 151a and first drain diffusion layer 151b, which are opposed to the inclined gate end portions 172 located at both ends of the gate electrode 68, will serve as accumulation layers. A metal film may be used as the conductive film which forms the gate electrode 68. The reason is that since the high-temperature anneal step for activating the source and drain has been finished, the gate electrode 68 is not affected by the high-temperature step. For example, a lamination structure of TiN and Al can be used.

Figure 17A:
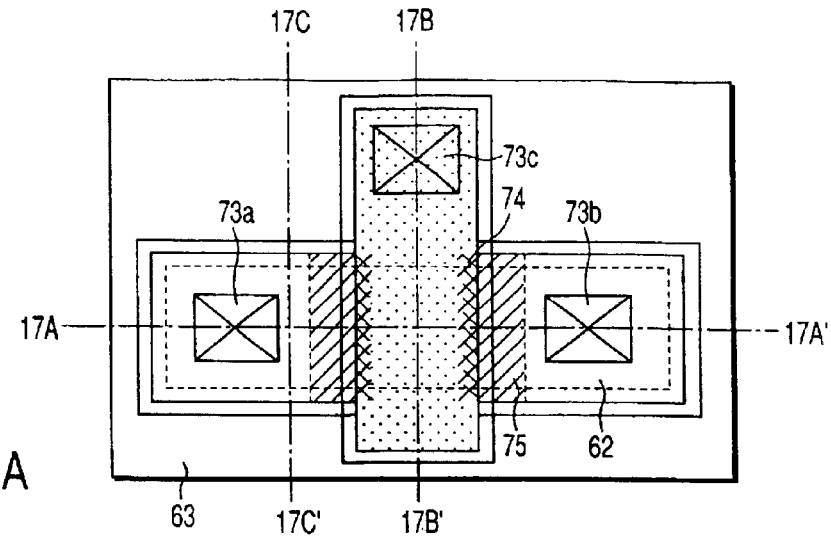
FIG. 17A is a plan view illustrating a manufacturing step of a semiconductor device according to the fourth embodiment of the invention.
Figure 17B:
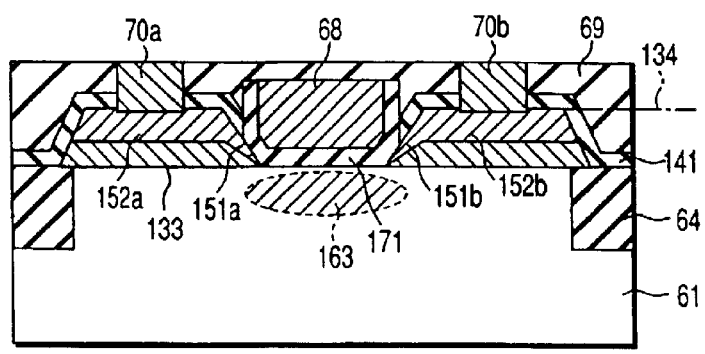
FIG. 17B is a cross-sectional view of the semiconductor device according to the fourth embodiment.
Figure 17C:
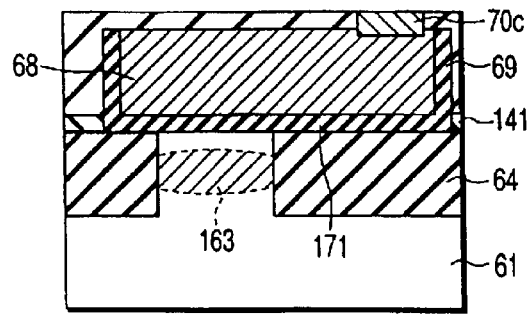
FIG. 17C is a cross-sectional view of the semiconductor device according to the fourth embodiment.
Figure 17D:
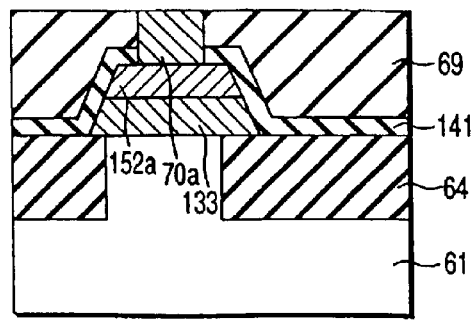
FIG. 17D is a cross-sectional view of the semiconductor device according to the fourth embodiment.

As is shown in FIG. 17B, the polysilicon film 154 is removed by a CDE (Chemical Dry Etching) process, and an interlayer insulating film 69 is formed. Before the polysilicon film 154 is removed by the CDE, an insulative film on the polysilicon film 154 is removed by CMP, etc. and the surface is exposed, with a cap of an insulative film used on the gate electrode 68 according to the kind of the conductive film used for the gate electrode 68. The steps following the formation of the interlayer insulating film 69 are the same as those in the first embodiment.

In the concave-type transistor formed by the above steps, the epitaxial layer surface 134 corresponds to the substrate surface 66 in the first embodiment. The channel plane 65 of the concave-type transistor structure is the surface of the silicon substrate 61. In the first embodiment, by contrast, the surface of the silicon substrate 61, which was etched by the RIE, is used as the channel plane 65.

In the above steps, the dummy gate 132 of the nitride film is used to form the selective epitaxial regions 133 for the source and drain inclined at about 50° to the surface of the silicon substrate 61 by the solid-phase growth with use of the (111) plane. Alternatively, a (311) plane at a less angle of about 30° may be used. In this case, the dummy gate is formed of a lamination film of an $SiO_2$ film 50 nm thick and a nitride film 50 nm thick, and selective epitaxial regions are formed by vapor-phase growth.

According to the present embodiment, when the dummy gate 132 is formed, the position of the gate is determined by lithograph and also the positions of the inclined source and drain are determined in a self-alignment manner. Accordingly, the factor of variance in channel length is decreased, compared to the first embodiment in which different lithographic steps are needed at the time of forming the recess portion and at the time of forming the gate electrode.

Besides, the channel plane 65 is not exposed to the RIE, and the surface of the silicon substrate 61 is not damaged at the time of etching. With use of the selective-epitaxial regions 133, the advantage of the suppression of the short-channel effect of the concave-type transistor can be obtained while the same high-quality silicon surface as with the flat-type transistor is used. Since the surfaces of the portions of the epitaxial regions 133, which adjoin the gate electrode 68, are grown obliquely, the inclined first source diffusion layer 151a and first drain diffusion layer 151b can be formed.

In the present embodiment, since the ion-implanted layer 163 for controlling threshold voltage can be selectively formed in the channel portion below the gate electrode 68. In order to realize the selective-epitaxial layers used in the present embodiment, the dummy gate 132 of $Si_3N_4$ is used so that silicon layers may selectively be grown except the region where the gate electrode 68 is to be provided. Specifically, with use of the dummy gate 132, the other portions of the transistor are formed, and thereafter the dummy gate 132 is removed and the gate electrode 68 (Damascene gate) is buried by a so-called Damascene process. Using the Damascene-gate process, ions can be implanted selectively in the channel portion alone.

(Fifth Embodiment)

FIG. 18A to FIG. 19D are views for describing a concave-type MIS transistor according to a fifth embodiment of the present invention. The fifth embodiment relates to a fabrication process for realizing a structure having features of the first concave-type MIS transistor configuration of the invention as shown in FIG. 6B. The manufacturing steps of the fifth embodiment to a certain stage are common to those of the fourth embodiment, and a detailed description thereof is omitted.

In the fourth embodiment, the contact holes 73a and 73b for contact with the second source diffusion layer 152a and second drain diffusion layer 152b are formed on the epitaxial regions 133 at a distance from the gate electrode 68. In order to prevent short-circuit between the gate and wiring, when the contact holes 73a and 73b are formed in the interlayer insulating layer 69 by the lithography and RIE, the gate electrode 68 needs to be separated from the wiring 70, and this is achieved by providing a sufficient distance therebetween. On the other hand, in order to miniaturization of the integrated circuits, the distance between the contact hole 73a, 73b and the gate electrode 68 should desirably be reduced.

In the present embodiment, side walls 191 of nitride films are formed on the inclined first source diffusion layer 151a and first drain diffusion layer 151b. Thereby, the distance between the gate and contact on the mask is reduced to substantially zero, and the contact is formed in a self-alignment manner. Thus, the area for forming the transistor is greatly reduced.

The process of fabricating the concave-type MIS transistor of this embodiment will now be described with reference to FIG. 18A to FIG. 19D. Using the dummy gate 132, the second source diffusion layer 152a and second drain diffusion layer 152b are formed. Then, the dummy gate 132 is removed and the recess 161 is formed, and the ion-implanted layer 163 is formed. The steps up to this stage are the same as those of the fourth embodiment as shown in FIGS. 12A to 15D.

Following the steps shown in FIGS. 15A to 15D, the $SiO_2$ films 131 and 141 are removed from the bottom and side walls of the recess portion 161, and the gate insulating film 171 is formed in the recess portion 161 by means of, e.g. thermal oxidation, as shown in FIGS. 18A to 18D. This gate insulating film 171 is formed thinner than the $SiO_2$ film 141, and thus the gate end portions 172 inclined to the surface of the silicon substrate 61 are formed.

Subsequently, a conductive film is formed on the entire surface so as to fill the recess portion 161, following which the conductive film portions outside the recess portion are polished and removed by the CMP. Then, the upper portion of the gate electrode 68 in the recess portion 161 is etched away by 10 nm by means of the RIE, and a nitride film is deposited. After the deposition of the nitride film, the nitride film portion outside the recess portion 161 is polished and removed by means of the CMP and a protection nitride film 192 for the gate electrode 68 is formed.

Figure 18A:
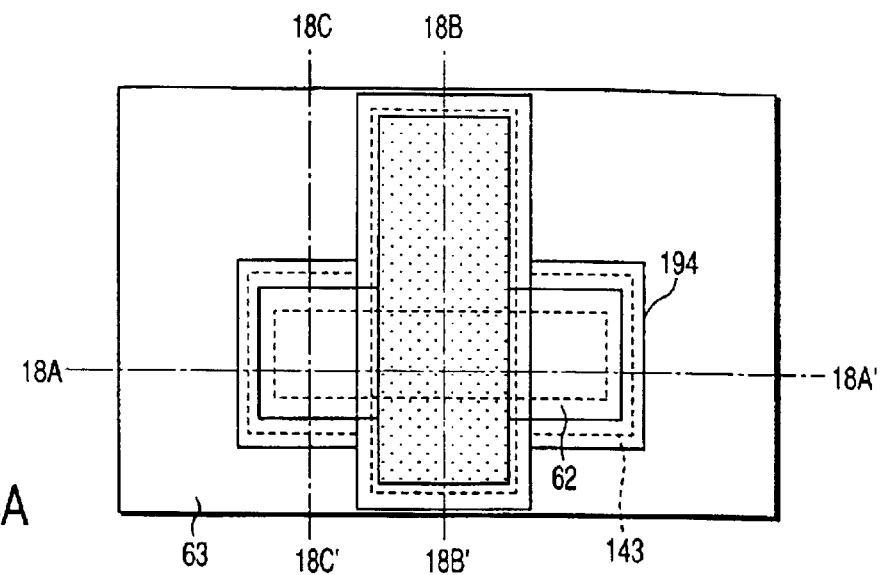
FIG. 18A is a plan view illustrating a manufacturing step of a semiconductor device according to a fifth embodiment of the invention.
Figure 18B:
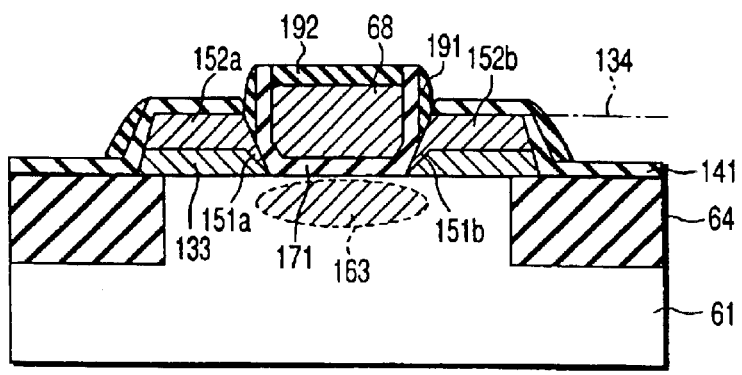
FIG. 18B is a cross-sectional view of the semiconductor device according to the fifth embodiment.
Figure 18C:
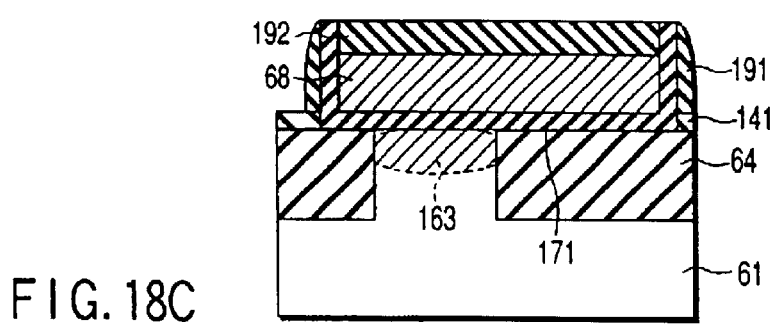
FIG. 18C is a cross-sectional view of the semiconductor device according to the fifth embodiment.
Figure 18D:
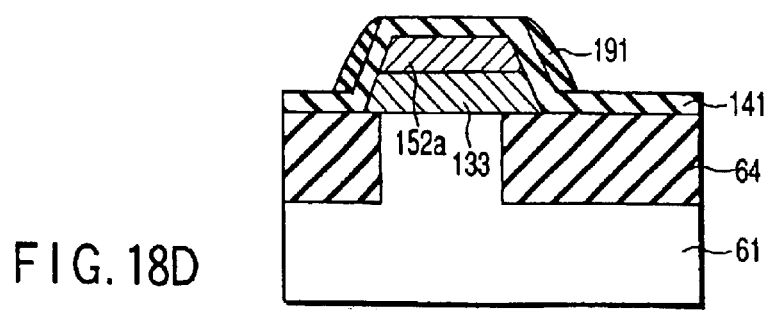
FIG. 18D is a cross-sectional view of the semiconductor device according to the fifth embodiment.

The surface of the polysilicon film 154 is washed by, e.g. a fluoric acid process, and then the polysilicon film 154 is removed by the CDE. After an $Si_3N_4$ film about 20 nm thick is deposited on the entire surface, this $Si_3N_4$ film on the entire surface is etched by the RIE so that a so-called sidewall-leaving process may be performed. As a result, the side walls 191 of $Si_3N_4$ are formed on the inclined first source diffusion layer 151a and first drain diffusion layer 151b. In FIG. 18A, broken lines 194 indicate the active region and gate electrode formation region which are thickened by the deposition of the $Si_3N_4$ film.

Figure 19A:
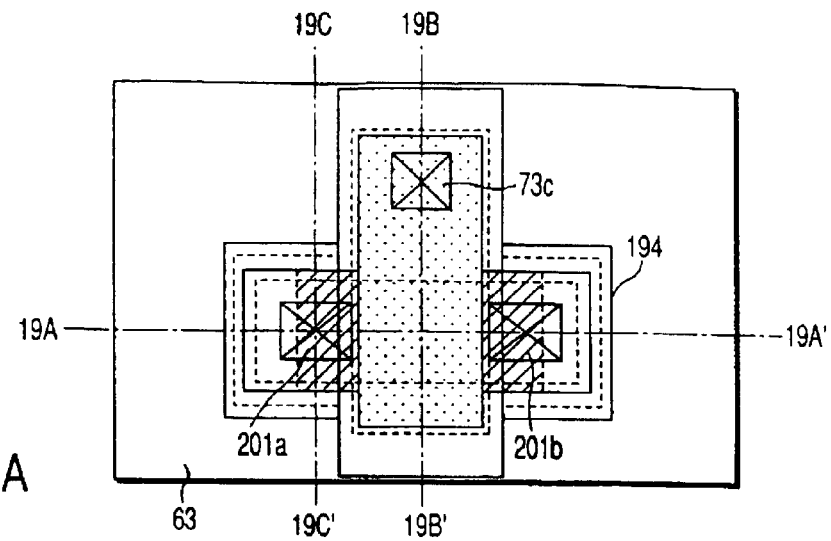
FIG. 19A is a plan view illustrating a manufacturing step of a semiconductor device according to the fifth embodiment of the invention.
Figure 19B:
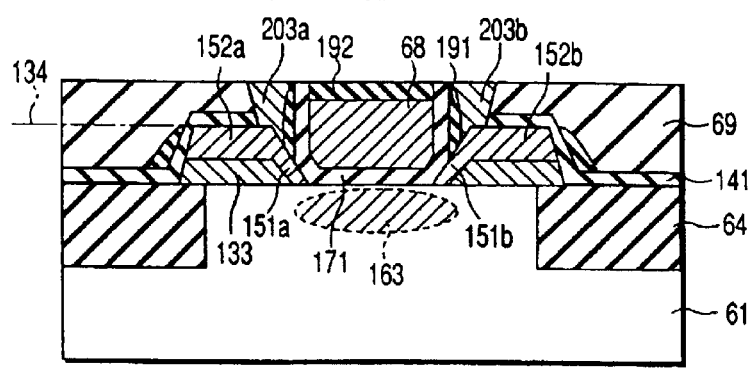
FIG. 19B is a cross-sectional view of the semiconductor device according to the fifth embodiment.
Figure 19C:
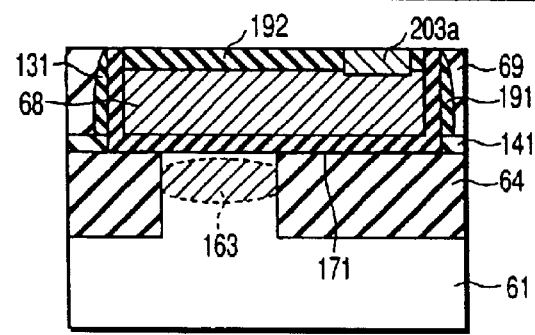
FIG. 19C is a cross-sectional view of the semiconductor device according to the fifth embodiment.
Figure 19D:
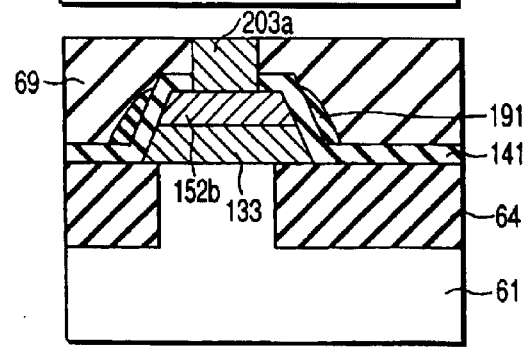
FIG. 19D is a cross-sectional view of the semiconductor device according to the fifth embodiment.

Following the above, as shown in FIG. 19B, the interlayer insulating film 69 is deposited on the entire surface, and contact holes 201a and 201b are formed by the RIE. A mask pattern for the contact holes 201a and 201b in this embodiment is designed such that the distance between the contact hole 201a, 201b and the gate electrode 68 is zero or the contact hole 201a, 201b overlap the gate electrode 68. Even if the RIE for forming contact holes for contact with the source and drain is performed near the gate electrode 68, the gate electrode 68 is protected by the side walls 191 and protection nitride film 192. Accordingly, the wiring 203 can be buried in the contact holes without short-circuit to the gate electrode 68.

In the present embodiment, since the $Si_3N_4$ side walls 191 are formed on the outside surfaces of the gate end portions 172 having the same inclination as the first source diffusion layer 151a and first drain diffusion layer 151b, the short-channel effect in the concave-type channel MIS transistor can be suppressed. In addition, since the gate electrode 68 is separated from the source/drain, a parasitic capacitance can be suppressed. Moreover, since the wiring 203 is formed by using the contact holes formed in the self-alignment manner, the transistor area can be reduced, the distance between the channel and wiring 203 is reduced to a minimum, and the parasitic resistance can be prevented.

In the present embodiment, the surfaces of the first source diffusion layer 151a and first drain diffusion layer 151b, which are opposed to the insulating films 171 and 191 and connect the accumulation layers of the first source diffusion layer 151a and first drain diffusion layer 151b and the wiring 203, are formed linear. Thus, the current path can be shortened, the parasitic resistance can be further decreased, and the resistance of the transistor is further reduced.

(Sixth Embodiment)

FIGS. 20A to 24B are views for describing a sixth embodiment of the invention. In this embodiment, like the first embodiment, the recess portion is formed by using the RIE but the method of forming the source and drain are different.

Specifically, in the first embodiment, the inclined source diffusion layer 71a and drain diffusion layer 71b are formed after the recess portion, gate insulating film 67 and gate electrode 68 are formed. In the present embodiment, on the other hand, impurity regions, which will become the source and drain, are formed in a surface portion of the silicon substrate 61 before the recess portion is formed. The surface of the silicon substrate 61 is etched so as to have inclined side surfaces. Thereby, an inclined source diffusion layer and drain diffusion layer are formed. The manufacturing steps of this embodiment will now be described with reference to FIGS. 20A to 24B.

As is shown in FIG. 20B, a device isolation insulating film 64 is formed on the p-type silicon substrate 61 at a peripheral portion of the active region 62. For example, using reactive ion etching (RIE), a trench about 0.35 $\mu$m deep is formed. An insulating film 64 of $SiO_2$ is buried in the trench to effect device isolation called STI (Shallow Trench Isolation). Then, a sacrificial $SiO_2$ film 211 with a thickness of about 10 nm is formed on the active region 62, for example, by a thermal oxidation method. Subsequently, a channel ion-implanted layer (not shown) for threshold voltage control is formed. Then, an impurity region 212 with an impurity concentration of about $3\times10^{20}$ $cm^{-3}$, which becomes impurity regions of the source and drain, is formed by ion implantation.

In the case of a CMOS (Complementary Metal-Oxide-Semiconductor) configuration wherein an n-channel MIS transistor and a p-channel MIS transistor are formed on a single substrate, a p-type well is formed in an n-channel transistor formation region of the silicon substrate 61 and then an n-type impurity region is formed as the impurity region 212. The present embodiment is directed to the fabrication of the n-channel transistor. In the case of a p-channel transistor, the types of impurities are reversed. In addition, the impurity region 212, which becomes the source and drain, may be formed of a high-concentration epitaxial region grown on the entire surface of the active region 62.

Figure 21A:
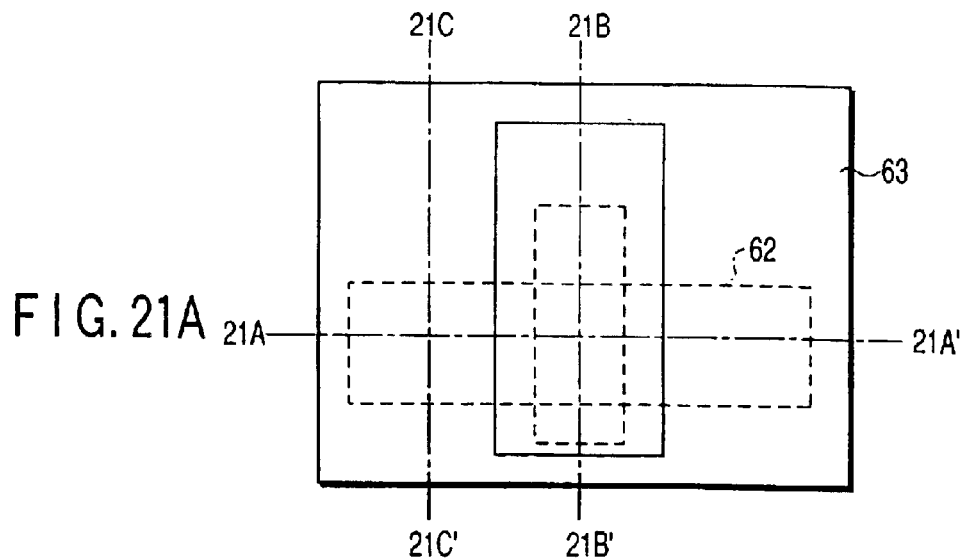
FIG. 21A is a plan view illustrating a manufacturing step of a semiconductor device according to the sixth embodiment of the invention.
Figure 21B:
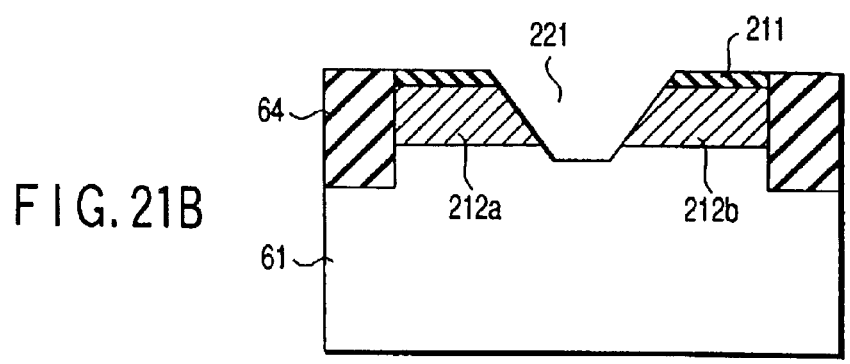
FIG. 21B is a cross-sectional view of the semiconductor device according to the sixth embodiment.
Figure 21C:
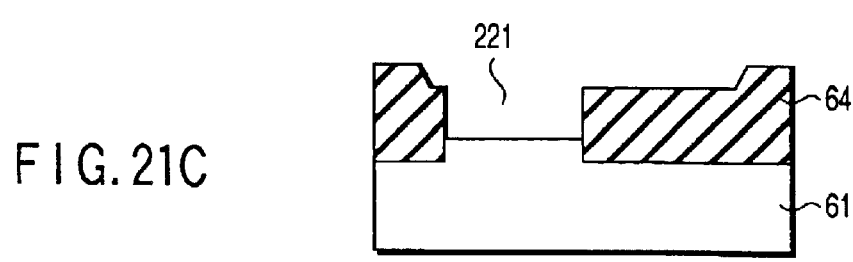
FIG. 21C is a cross-sectional view of the semiconductor device according to the sixth embodiment.
Figure 21D:
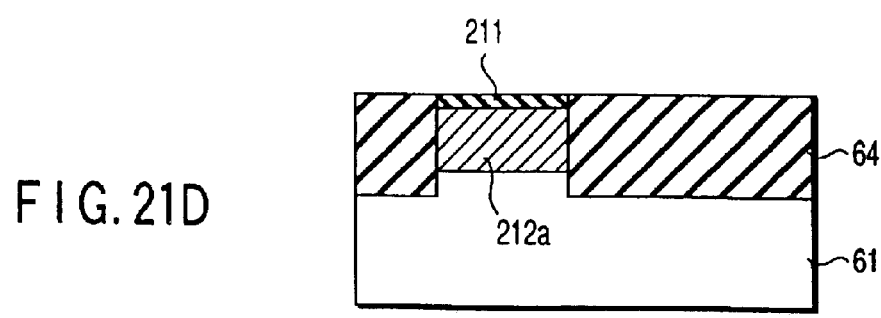
FIG. 21D is a cross-sectional view of the semiconductor device according to the sixth embodiment.

Following the above, as shown in FIG. 21B, as in the case of the formation of the recess portion 92 in the first embodiment shown in FIG. 7B, a recess portion 221 is formed with use of a mask having the same photoresist pattern as that for forming, e.g. the gate electrode. Then, an RIE damage repair process is performed. Subsequently, the impurity region 212 is activated by heat treatment, e.g. at 800° C. for about 5 minutes, thereby forming a source diffusion layer 212a and a drain diffusion layer 212b.

The region including the recess portion 221 is a region for forming the channel portion and inclined source and drain of the concave-type transistor in the active region 62. This region is obtained by selectively etching the silicon substrate 61 with an inclination. The conditions for the RIE are controlled such that the angle formed between the surface of the silicon substrate 61 and the tapered side surface of the recess portion 221 is large to the vertical plane. Thereby, the parasitic capacitance between the gate electrode 68 to be formed later as shown in FIG. 23 and the source diffusion layer 212a and that between the gate electrode 68 and the drain diffusion layer 212b are decreased. On the other hand, the angle formed between the surface of the silicon substrate 61 and the tapered side surface of the recess portion 221 is small to the horizontal plane. Thereby, the effective thickness of the source diffusion layer 212a and drain diffusion layer 212b adjacent to the gate electrode 68 is sufficiently increased and the parasitic resistance is reduced. For example, this angle is set at 60° to a plane perpendicular to the surface of the silicon substrate 61.

When the mask for the gate electrode 68 is used to form the recess portion 221, a recess portion may also be formed in that portion of the device isolation insulating film 64 between the gate electrode 68 and the contact hole, with a sufficient thickness of the device isolation insulating film 64 being kept.

Figure 22A:
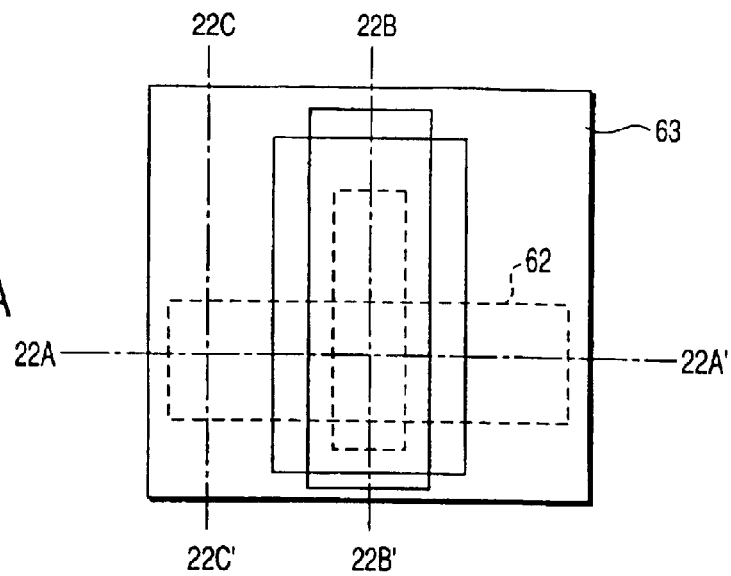
FIG. 22A is a plan view illustrating a manufacturing step of a semiconductor device according to the sixth embodiment of the invention.
Figure 22B:
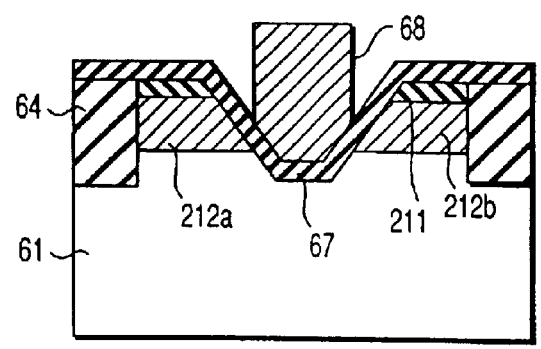
FIG. 22B is a cross-sectional view of the semiconductor device according to the sixth embodiment.
Figure 22C:
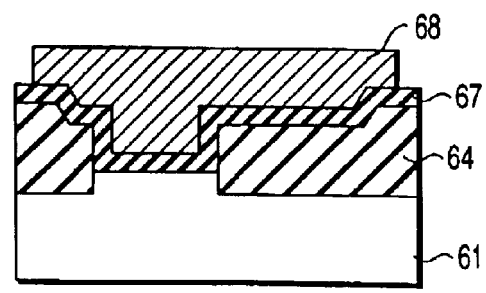
FIG. 22C is a cross-sectional view of the semiconductor device according to the sixth embodiment.
Figure 22D:
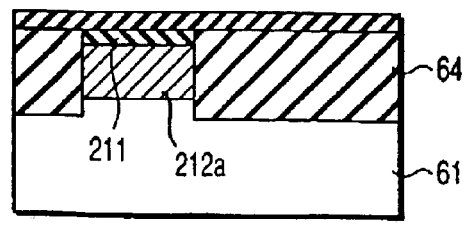
FIG. 22D is a cross-sectional view of the semiconductor device according to the sixth embodiment.

After the gate insulating film 67 is formed, as shown in FIG. 22B, the gate electrode 68 is formed to have the following structural features. The edges of the gate electrode 68 have chamfered shapes defined by the inside of the recess portion 221 and are located outside the channel plane 65. In addition, the gate electrode 68 has such regions that the gate electrode 68 is opposed to the source diffusion layer 212a via the gate insulating film 67 and the gate electrode 68 is opposed to the drain diffusion layer 212b via the gate insulating film 67.

The gate insulating film 67 is a lamination film including an insulating film formed by a low-temperature process. Specifically, prior to the formation of the gate insulating film 67 by heat treatment, the impurity region 212 which becomes the source and drain is formed. Unlike the first embodiment, attention needs to be paid so as to prevent the junction plane of the impurity region 212 from becoming deeper than the channel plane 65 toward the silicon substrate 61. For example, a lamination film including a $CVD-SiO_2$ film, a CVD-SiON film or a $CVD-Si_3N_4$ film is used as the gate insulating film 67.

The patterning is made to provide regions where the gate electrode 68 is opposed to the impurity region 212 with the gate insulating film 67 interposed, whereby the regions of formation of the accumulation layers in the source and drain, which are continuous with the channel inversion layer and are shallower than the channel plane 65, can be formed when the transistor is operated. If a recess portion is also formed in the device isolation insulating film 64 when the recess portion 221 is formed, the thickness of the gate wiring on the device isolation insulating film 64 can be increased by a degree corresponding to this recess portion and the resistance of the gate wiring can be decreased.

Figure 23A:
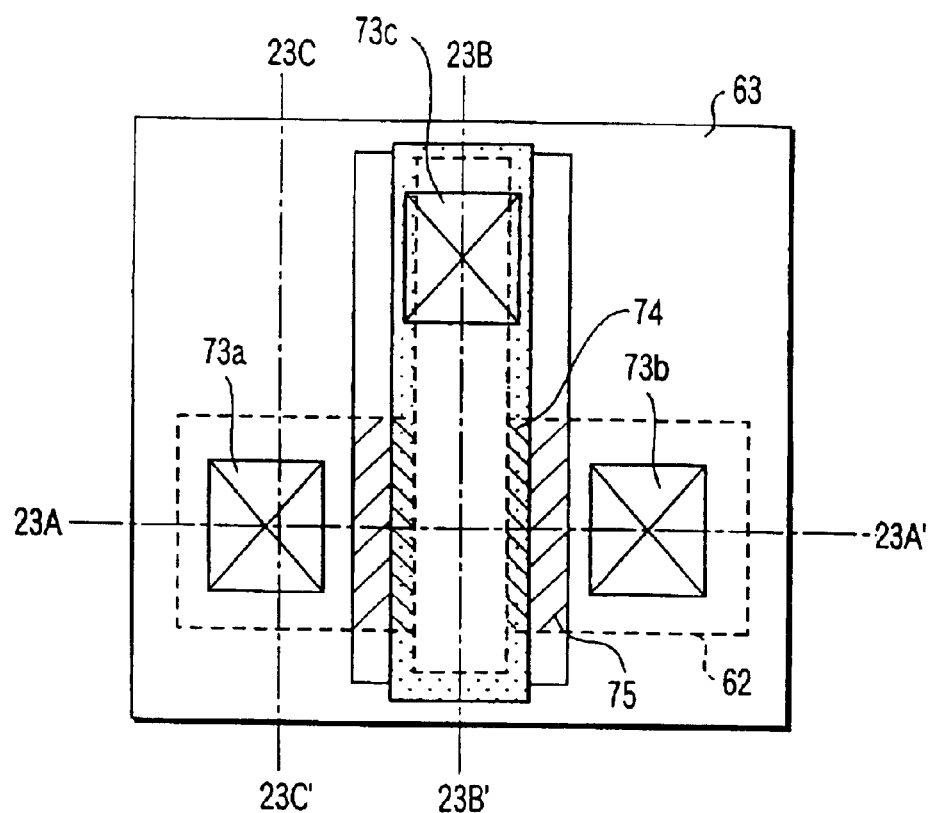
FIG. 23A is a plan view illustrating a manufacturing step of a semiconductor device according to the sixth embodiment of the invention.
Figure 23B:
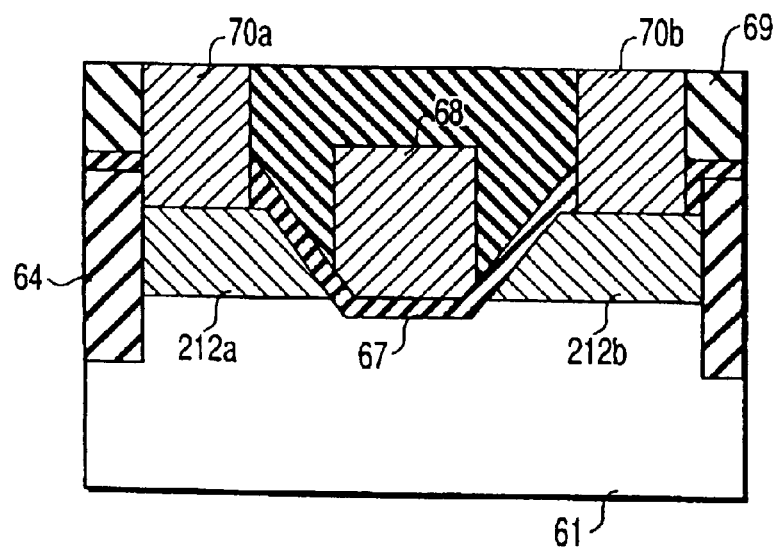
FIG. 23B is a cross-sectional view of the semiconductor device according to the sixth embodiment.
Figure 24A:
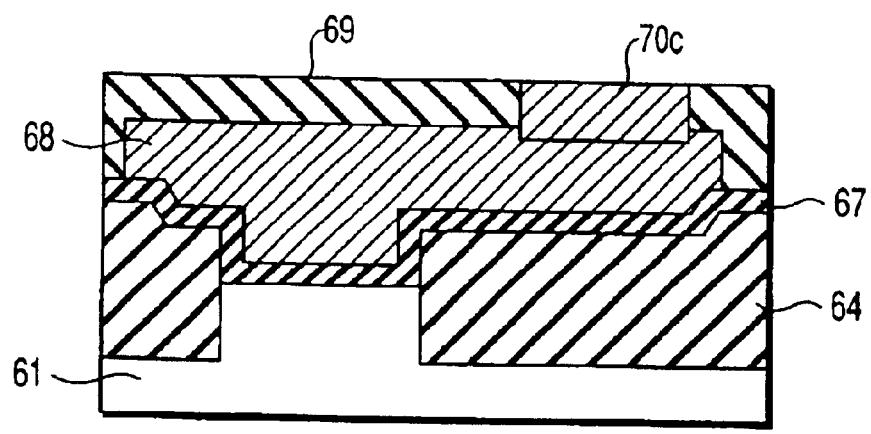
FIG. 24A is a cross-sectional view of the semiconductor device according to the sixth embodiment.
Figure 24B:
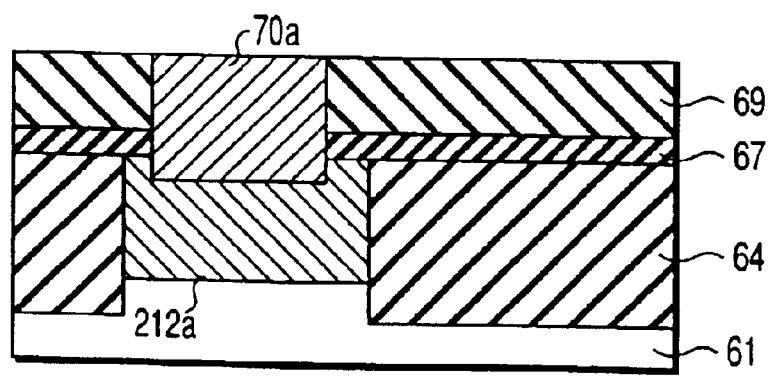
FIG. 24B is a cross-sectional view of the semiconductor device according to the sixth embodiment.

Thereafter, as shown in FIGS. 23A to 24B, the interlayer insulating film 69 of $SiO_2$ is formed on the entire surface. Using the same process as in the first embodiment, contact holes 73a and 73b are formed and the wiring 70a and 70b is provided. A passivation film (not shown) is formed on the entire surface and the fabrication of the transistor portion according to the fourth embodiment is completed. In FIG. 23A, the inclined source diffusion layer and drain diffusion layer in the fourth embodiment are indicated by hatching lines.

Figure 25A:
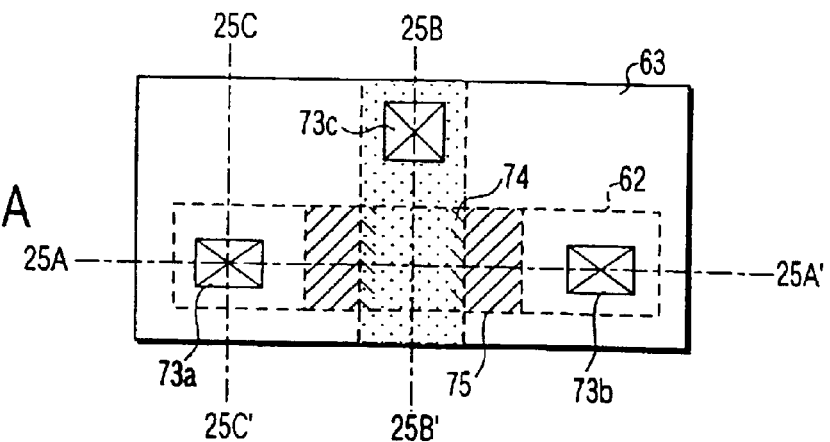
FIG. 25A is a plan view illustrating a manufacturing step of a semiconductor device according to a modification of the sixth embodiment of the invention.
Figure 25B:
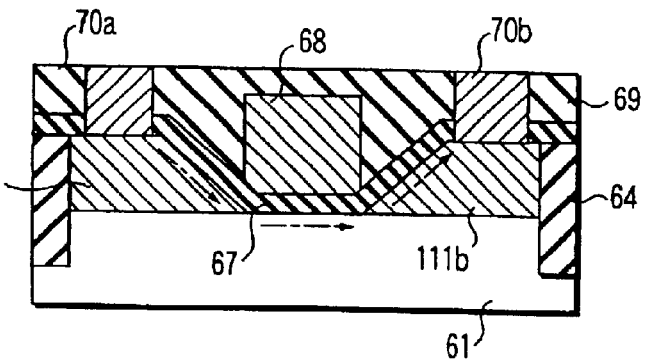
FIG. 25B is a cross-sectional view of the semiconductor device according to the modification of the sixth embodiment.
Figure 25C:
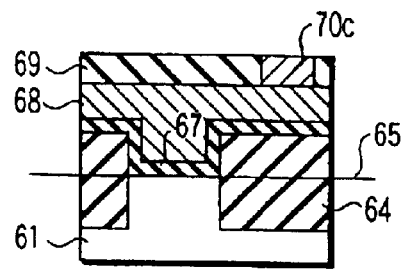
FIG. 25C is a cross-sectional view of the semiconductor device according to the modification of the sixth embodiment.
Figure 25D:
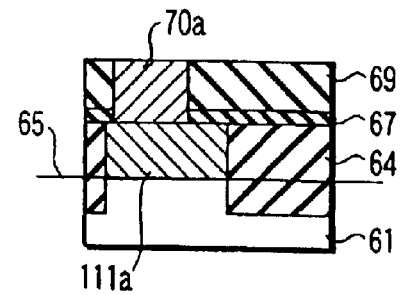
FIG. 25D is a cross-sectional view of the semiconductor device according to the modification of the sixth embodiment.

FIGS. 25A to 25D show a whole structure of a concave-type MIS transistor according to a modification of the present embodiment. FIG. 25A is a top view; FIG. 25B is a cross-sectional view taken along line 25A–25A' in FIG. 25A; FIG. 25C is a cross-sectional view taken along line 25B–25B' in FIG. 25A; and FIG. 25D is a cross-sectional view taken along line 25C–25C' in FIG. 10A. In the following description, the structural parts common to those in the first, embodiment are denoted by like reference numerals, and a detailed description thereof is omitted.

In the case of the first embodiment shown in FIG. 6B, not only the boundary planes between the gate insulating films 67 and the first source diffusion layer 71a and first drain diffusion layer 71b, which are adjacent to the gate electrode 68, but also the boundary planes between the silicon substrate 61 and the first source diffusion layer 71a and first drain diffusion layer 71b, are formed at an angle to the surface of the silicon substrate 61. On the other hand, in the present modification, as shown in FIG. 25B, only the boundary planes between the gate insulating film 67 and the source diffusion layer 111a and drain diffusion layer 111b, where a main current path will be formed, are formed an angle to the surface of the silicon substrate 61. The depth of the boundary planes with the silicon substrate 61 is kept at zero or a minus value with respect to the channel plane 65, and these planes are formed in parallel to the surface of the silicon substrate 61.

The main current path created when the transistor of this modification is operated is the same as in the first embodiment, as indicated by a dot-and-dash line in FIG. 9. Furthermore, the source diffusion layer 111a and drain diffusion layer 111b are formed above the channel plane 65 at an angle to the surface of the silicon substrate 61. Accordingly, like the first embodiment, the short-channel effect can be suppressed and the parasitic resistance and parasitic capacitance can be reduced.

(Seventh Embodiment)

Figure 26:
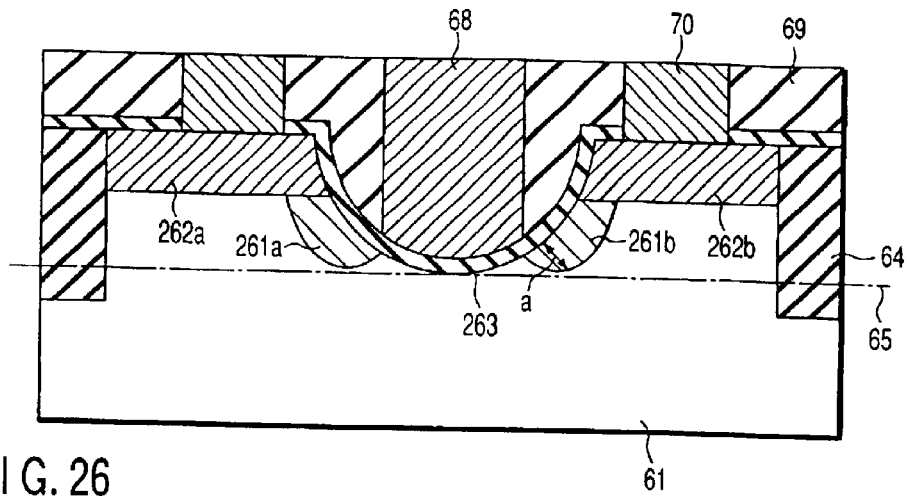
FIG. 26 is a cross-sectional view illustrating the entire structure of a semiconductor device according to a seventh embodiment of the invention.

FIG. 26 is a cross-sectional view showing the entire structure of a semiconductor device according to a seventh embodiment of the invention. This embodiment is a modification of the first embodiment. A description of the portions common to those in the first embodiment is omitted. In the present embodiment, the radius of curvature of the current path is increased so that the current path may extend substantially linearly when locally observed. Thereby, the short-channel effect is suppressed and the current path is shortened.

The manufacturing steps of the semiconductor device according to this embodiment are substantially the same as those in the first embodiment. According to this embodiment, when the recess portion 92 in the first embodiment shown in FIGS. 7A to 7D is formed, the etching conditions are controlled so as to round the inclined side surfaces of the recess portion 92 or the surface defining the channel region.

The source and drain are formed to comprise not only the first source diffusion layer 261a and first drain diffusion layer 261b but also the second source diffusion layer 262a and second drain diffusion layer 262b in order to compensate the thickness of the diffusion layers 261a and 261b.

After the gate insulating film 263 is formed, the edges of the gate electrode 68 are formed such that the edges are rounded by the inside of the recess portion 221 and located outside the channel region and that regions are formed where the gate electrode 68 is opposed to the first source diffusion layer 261a and first drain diffusion layer 261b with the gate insulating film 263 interposed.

The device of this embodiment differs from the conventional concave-type transistor in the respects stated below.

Compared to the conventional concave-type transistor shown in FIG. 4A, the current path is curved and shortened. This is realized by controlling the etching conditions so that a curved shape is defined from the channel region toward the source diffusion layer 261a and drain diffusion layer 261b. Since the gate insulating film 263 formed on the side surfaces of the gate electrode 68 are rounded, the effective film thickness of the insulating film between the gate electrode 68 and the source and drain is increased and the parasitic capacitance is suppressed. The accumulation layers in the source and drain, which are continuous with the channel region, are located at an angle above the channel region, and the short-channel effect is suppressed. Accordingly, the current path from the channel to the accumulation layers is curved and a decrease in current amount is prevented.

In the first embodiment, the angles of the corner portions at both ends of the channel plane 65 of the regular concave-type transistor shown in FIG. 4A are changed from acute ones to obtuse ones, whereby the carrier distribution is made substantially linear. In the present embodiment, on the other hand, the obtuse-angled corner portions at both ends of the channel region are rounded, and thus the withstand voltage of the gate insulating film 263 is enhanced and the degradation in electron mobility at the corner portions can be prevented.

In addition, the radius of curvature can be increased, compared to the conventional concave-type transistor wherein the channel corner portions are formed at a small angle. Therefore, the withstand voltage can be effectively increased, and the degradation in electron mobility prevented.

The advantages obtained by making uniform the radius of curvature of the channel region formed in the recess portion are the same as in the second embodiment.

(Eighth Embodiment)

Figure 27:
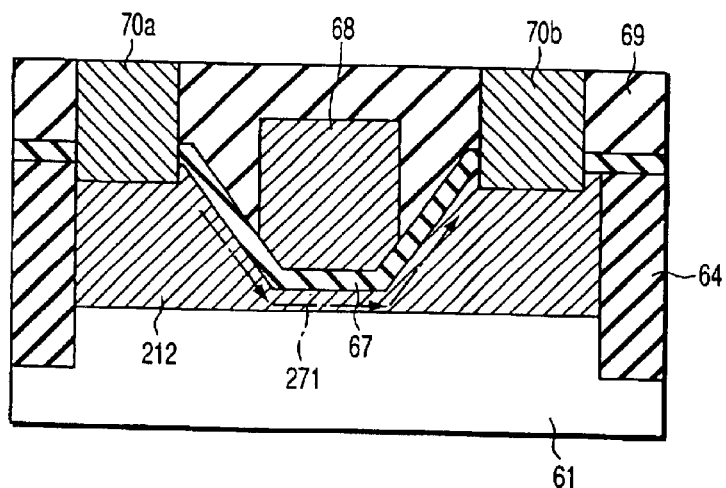
FIG. 27 is a cross-sectional view illustrating the entire structure of a semiconductor device according to an eighth embodiment of the invention.

FIG. 27 is a cross-sectional view showing the whole structure of a semiconductor device according to an eighth embodiment of the present invention. In this eighth embodiment, the structural elements common to those in the sixth embodiment are denoted by like reference numerals and a description thereof is omitted.

In the eighth embodiment, the present invention is applied to a so-called buried-channel type transistor which is one kind of a planer transistor. In the buried-channel type transistor, a region of the same conductivity type as the source and drain is provided in the channel portion, whereby a threshold voltage can be controlled at a desired value in accordance with a work function of the gate electrode 68. This transistor is effective, in particular, for a so-called CMOS circuit.

For example, in the case of an n-channel transistor, a gate insulating film 67 and a gate electrode 68 are formed above a p-type silicon substrate 61, with an n-type buried channel 271 interposed. In this embodiment, when the recess portion 221 in the fourth embodiment shown in FIG. 21B is formed by the RIE, the conditions for etching are controlled to make the depth of etching shallower than the junction plane of the impurity region 212. Thereby, the buried channel 271 is formed.

In the buried-channel concave-type transistor shown in FIG. 27, the edges of the gate electrode 68 are rounded by the inner part of the recess portion 221 and are located on the inclined side surfaces of the recess portion 221. Since this transistor is of the buried-channel type, the polarity of the source/drain is the same as that of the channel 271. Accordingly, where the conventional concave-type transistor shown in FIG. 4B is reconstructed as the buried-channel transistor, the inversion layer 47 on the side face of the recess portion and the inversion layer 46 on the bottom surface of the recess portion are changed to accumulation layers (not shown). The current path in the present embodiment shown in FIG. 27 is indicated by a dot-and-dash line.

The structure shown in FIG. 27 is superior to the structures of the other embodiments in that the threshold voltage can be controlled, as described above. This advantage will now be described in greater detail. In the structures of preceding embodiments wherein the corner portions at both ends of the channel plane 65 of the non-buried channel are exposed, when channel inversion layers are to be formed at the corner portions, electric fields are generated at the corner portions. As a result, the carrier density at the corner portions becomes lower than that at the channel plane 65 and the current value decreases.

In the concave-type transistor shown in FIG. 27, acute-angled portions of the corner portions at both ends of the channel plane 65 are not exposed and covered with impurity regions. Thereby, the carrier density at the corner portions are increased, and a decrease in current due to the low carrier density at the corner portions is suppressed.

The sixth, seventh and eighth embodiments are superior to the first embodiment in the following respect. In the first embodiment, the ion implantation 101 for forming the source diffusion layer and drain diffusion layer is performed, with the gate electrode 68 formed within the recess portion 92 used as a mask. If there occurs a positional displacement between the recess portion 92 and the gate electrode 68, the second source diffusion layer 72a and second drain diffusion layer 72b are formed asymmetrical. On the other hand, in the sixth to eighth embodiments, since the recess portion 161 is formed by etching the impurity regions formed asymmetrical in advance, no positional displacement occurs between the gate electrode 68 and the impurity regions and the lower ends of the source and drain are always formed symmetric.

The sixth, seventh and eighth embodiments are superior to the fourth embodiment in the following respect. In the fourth embodiment, the dummy gate is used to form the selective epitaxial region 133 and the manufacturing process is complicated. On the other hand, the sixth to eighth embodiments, the number of processing steps is smaller and accordingly the cost is reduced.

(Ninth Embodiment)

FIG. 28A to FIG. 29D are views for describing a semiconductor device according to a ninth embodiment of the invention. This embodiment aims at realizing the structure shown in FIGS. 10A to 10D.

The semiconductor device according to the present embodiment differs from the second embodiment in the following respect. In the second embodiment, after the selective epitaxial region 133, gate insulating film 67 and gate electrode 68 are formed, the first source diffusion layer 151a and first drain diffusion layer 151b with inclinations due to epitaxial layer facets are formed. On the other hand, in the present embodiment, epitaxial regions 281a and 281b including high-concentration impurities are formed as impurity regions which will become a source and a drain. Thereby, the source and drain, which have inclined boundary planes with the gate insulating film 171 and have junction planes with the silicon substrate 61 which are inclined parallel to the surface of the silicon substrate 61, are formed. The source and drain are formed according to the same manufacturing steps as in the fourth embodiment.

Figure 28A:
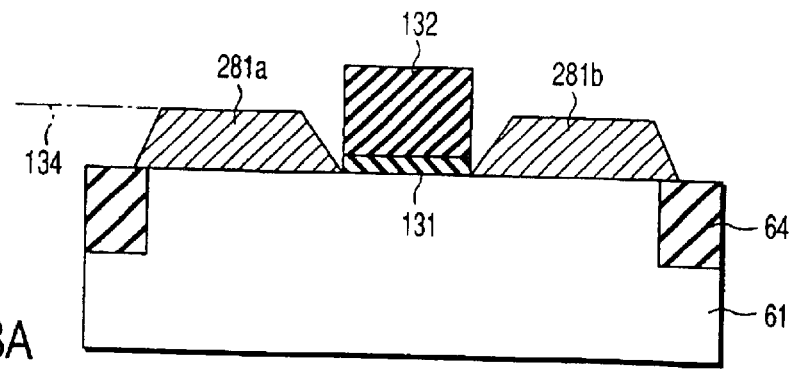
FIG. 28A is a cross-sectional view illustrating a manufacturing step of a semiconductor device according to a ninth embodiment of the invention.

The manufacturing process of this embodiment will now be described in comparison with the second embodiment. As is shown in FIG. 28A, selective-epitaxial impurity regions 281a and 281b are formed on the silicon substrate 61 on which a dummy gate 132 is formed. The regions, where the selective-epitaxial impurity regions 281a and 281b are formed, are the same as the regions where the selective-epitaxial regions 133 are formed in FIG. 12B.

In this embodiment, when amorphous silicon is deposited on the entire surface, arsine gas (AsH$_3$), for example, is supplied at a flow rate of 20 sccm in addition to hydrogen gas and SiH$_4$ gas. The selective growth epitaxial region 133 differs from the selective growth epitaxial impurity regions 281a and 281b in the following respect. The selective growth epitaxial region 133 is formed as the crystalline silicon layer including no impurities. On the other hand, the selective growth epitaxial impurity regions 281a and 281b are formed to contain high-concentration impurities under the above conditions, for example, arsenic in an amount of about $3 \times 10^{20}$ cm$^{-3}$ in the case of an n-type concave-type MOSFET.

Figure 28B:
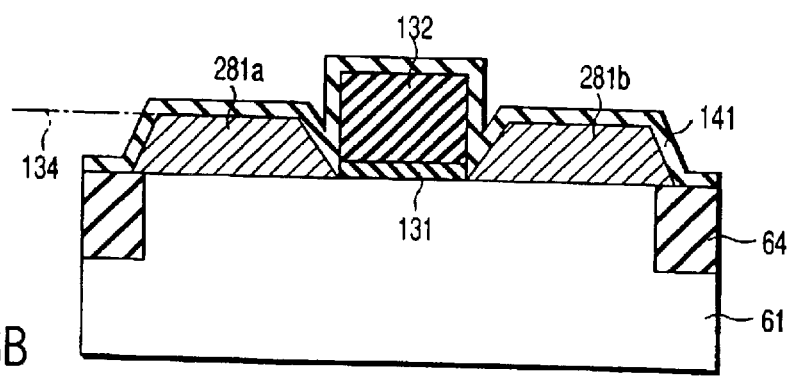
FIG. 28B is a cross-sectional view illustrating a manufacturing step of the semiconductor device according to the ninth embodiment of the invention.
Figure 28C:
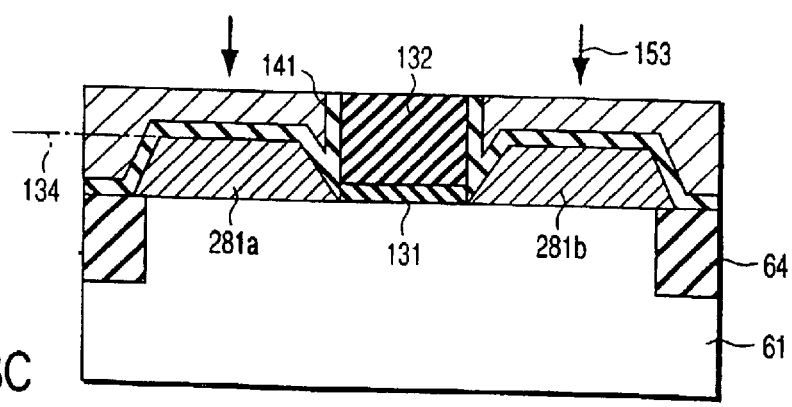
FIG. 28C is a cross-sectional view illustrating a manufacturing step of the semiconductor device according to the ninth embodiment of the invention.

Subsequently, an SiO$_2$ film 141 is formed as a protection film on the entire surface of the structure (FIG. 28B). This step is the same as that in FIG. 13B. In this embodiment, neither the ion implantation 142 nor activation anneal is performed. The reason is that there is no need to implant impurities since the selective epitaxial impurity region have already been formed to contain high-concentration impurities. A polysilicon film 154 is then formed to expose the upper surface of the dummy gate 132 (FIG. 28C). This step is the same as that in FIG. 16B.

Figure 29A:
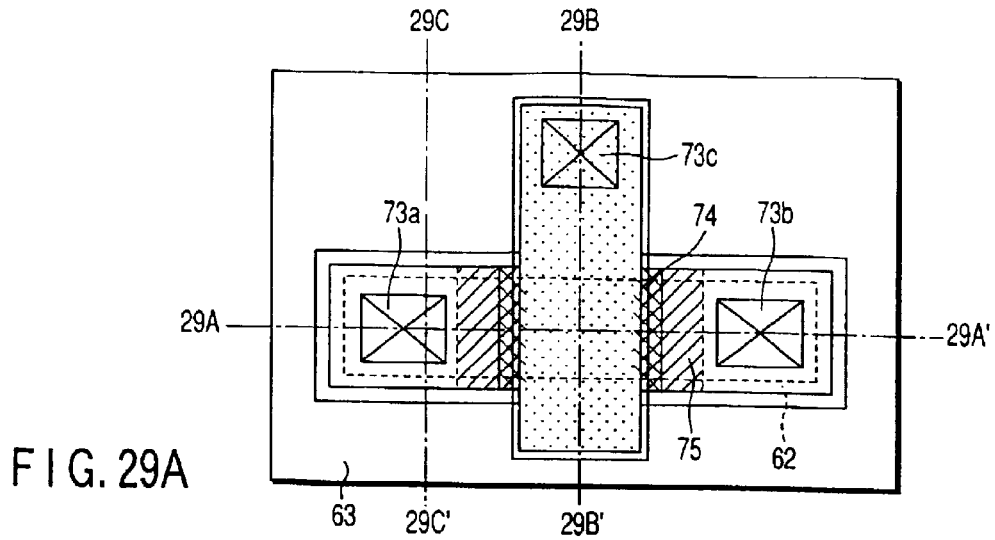
FIG. 29A is a plan view illustrating a manufacturing step of the semiconductor device according to the ninth embodiment of the invention.
Figure 29B:
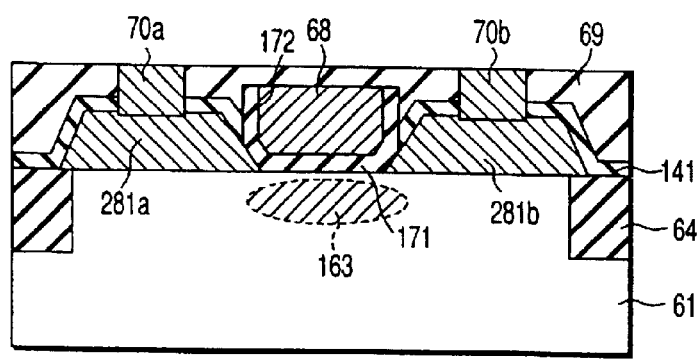
FIG. 29B is a cross-sectional view of the semiconductor device according to the ninth embodiment.
Figure 29C:
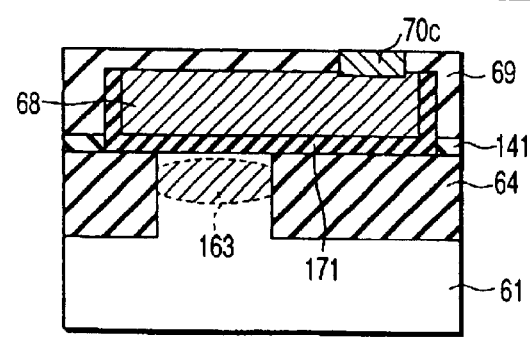
FIG. 29C is a cross-sectional view of the semiconductor device according to the ninth embodiment.
Figure 29D:
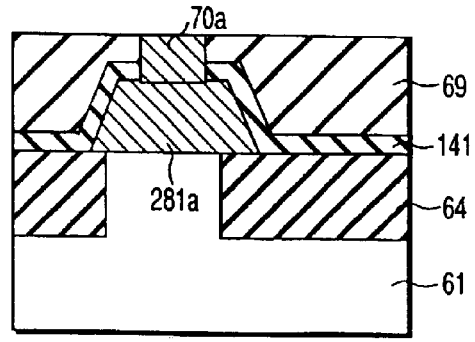
FIG. 29D is a cross-sectional view of the semiconductor device according to the ninth embodiment.

The subsequent manufacturing steps are the same as those in the second embodiment, and the finished concave-type transistor is obtained as shown in FIGS. 29A to 29D. FIG. 29A is a plan view; FIG. 29B is a cross-sectional view taken along line 29A–29A'; FIG. 29C is a cross-sectional view taken along line 29B–29B'; and FIG. 29D is a cross-sectional view taken along line 29C–29C'.

In this embodiment, as compared to the second embodiment, the ion implantation 142 for forming the impurity regions of the source and drain and the activation anneal step therefor are omitted, and the fabrication process is simplified. The gate insulating film 171 and the inclined gate end portions 172 are formed after the impurity regions 281a and 281b for forming the inclined source and drain are formed on the silicon substrate 61 in advance. Thus, the edges of the gate electrode 68 can automatically be formed outside the junctions of the inclined source and drain impurity regions in relation to the channel and on the side surfaces of the recess portion including the inclined source and drain. In addition, the gate electrode 68 is automatically formed to have regions opposed to the source and drain with the gate insulating film 171 interposed.

In the present embodiment, like the sixth embodiment, impurity regions 221a and 221b are provided which will become the source and drain having junction planes inclined parallel to the surface of the silicon substrate 61. This embodiment has an advantage over the sixth embodiment in that since the recess portion is formed not by means of the RIE but by means of the selective epitaxial growth using the nitride film on the channel portion as the mask, the substrate surface on which the channel is formed is not damaged by etching and the substrate surface protected by the nitride film can be used as the channel.

Moreover, in this ninth embodiment, the source and drain are formed of the impurity regions 281a and 281b inclined in a self-alignment manner with use of selective epitaxial growth. In the sixth embodiment, however, high-precision positioning needs to be performed by performing a lithographic process at the time of forming the recess portion and at the time of forming the gate electrode 68 within the recess portion. Therefore, in the ninth embodiment, the number of factors of variance in structure is less.

Furthermore, in the sixth embodiment, after the device isolation insulating film 64 shown in FIG. 20B is formed, the recess portion 221 is etched so as to expose the side surface of the device isolation insulating film 64, as shown in FIG. 21B. However, due to the shape of, e.g. the inclined side surface of the device isolation insulating film 64, the side surface is not exposed and the silicon portion is left. As a result, the device characteristics may be affected. In the present embodiment, by contrast, the recess portion is not formed in the substrate and the source and drain are formed in projecting shapes by using the epitaxial layers formed selectively on the substrate, as shown in FIG. 28C. In association with these source and drain, the channel portion and the inclined source and drain are formed as the recess portion. Accordingly, the side surfaces of the device isolation insulating film 64 shown in FIG. 28B are not exposed, and the influence of the shapes of the side surfaces upon the device characteristics in the sixth embodiment can be avoided.

[Tenth Embodiment]

Figure 30:
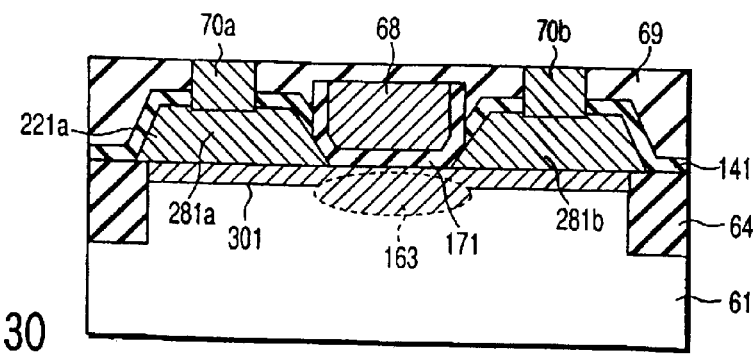
FIG. 30 is a cross-sectional view showing the entire structure of a semiconductor device according to a tenth embodiment of the invention.

FIG. 30 is a cross-sectional view showing the whole structure of a semiconductor device according to a tenth embodiment of the present invention. In this embodiment, the method of fabricating the semiconductor device according to the ninth embodiment is applied to an buried-channel concave-type transistor. A description of the structural parts common to those in the ninth embodiment is omitted, and only different portions will be described.

In the buried-channel concave-type transistor according to this embodiment, a buried-channel impurity region 301 is formed is formed in a surface portion of the active region, too. Specifically, the impurity region 301 having the same polarity as the source and drain is formed on that part of the silicon substrate 61, which is opposed to the bottom of the gate electrode 68 with the gate insulating film 171 interposed. This buried-channel concave-type transistor is advantageously applicable to a CMOS circuit, as in the eighth embodiment.

The present embodiment is fabricated by the same method as in the ninth embodiment. Before the SiO$_2$ film 131 shown in FIG. 28B is formed, however, the buried-channel impurity region 301 is formed on the active region 62 by means of, e.g. ion implantation. Subsequently, the same process as in the ninth embodiment is performed. Thereby, the epitaxial regions 281a and 281b, which become the source and drain, can be connected by the region 301 having the same polarity.

According to the present embodiment, the structure having the advantages of both the eighth and ninth embodiments can be realized.

In the present invention, as has been described above, there are provided the regions where the gate electrode is opposed to the source and drain. Since these regions function as accumulation layers, the spreading resistance is eliminated and the channel and contact are connected by a short current path with low resistance. Accordingly, the parasitic resistance is reduced.

Besides, the regions functioning as the accumulation layers are formed shallower than the channel region, and there is no need to form regions functioning as accumulation layer on the same plane as the channel region. Therefore, the short-channel effect can be suppressed.

Furthermore, since the source and drain on the side surfaces of the gate electrode are inclined with respect to the surface of the semiconductor layer, the distance between the gate electrode and the source and the distance between the gate electrode and the drain are increased and the parasitic capacitance is reduced.

In the embodiments, needless to say, the same advantages can be obtained in a case where one of the source and drain has the structure of the present invention and the other has a conventional structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a MIS type semiconductor device, the method comprising:

laminating a first insulating film and a dummy gate selectively on a first semiconductor layer;

selectively growing a semiconductor material in a solid phase, with the dummy gate used as a mask, thereby forming a second semiconductor layer with an obtuse-angled side wall, the second semiconductor layer sandwiching the dummy gate;

injecting an impurity into a surface of the second semiconductor layer with the dummy gate used as a mask, thereby forming a diffusion layer whose lower surface is higher than a surface of the first semiconductor layer;

removing the first insulating film and the dummy gate to expose a recess portion including a bottom surface and a taper portion with an inclination substantially equal to an inclination of the side wall of the second semiconductor layer;

forming a gate insulating film on the bottom surface and the taper portion of the recess portion;

forming a gate electrode on the gate insulating film;

forming an interlayer insulating film on the second semiconductor layer; and selectively removing the interlayer insulating film to form a contact hole on a surface of the diffusion layer.

2. A method of manufacturing a MIS type semiconductor device according to claim 1, further comprising:

forming a second insulating film to cover the second semiconductor layer and a surface of the dummy gate; and accumulating a filler on the second insulating film, and etching and flattening a surface of the filler, thereby exposing the dummy gate, wherein said removing the first insulating film and the dummy gate also removes a portion of the second insulating film formed on a side wall of the dummy gate.

3. A method of manufacturing a MIS type semiconductor device according to claim 1, further comprising:

following the formation of the gate electrode, forming an additional insulating film for protecting the gate electrode on a side wall and a surface of the gate electrode, wherein said forming a contact hole forms the contact hole in a self-alignment manner with respect to the gate electrode by selectively removing the interlayer insulating film with the additional insulating film used as a mask.

* * * * *